United States Patent
Miyairi et al.

(10) Patent No.: US 9,847,406 B2
(45) Date of Patent: Dec. 19, 2017

(54) SEMICONDUCTOR DEVICE, STORAGE DEVICE, RESISTOR CIRCUIT, DISPLAY DEVICE, AND ELECTRONIC DEVICE

(71) Applicant: Semiconductor Energy Laboratory Co., Ltd., Atsugi-shi, Kanagawa-ken (JP)

(72) Inventors: Hidekazu Miyairi, Kanagawa (JP); Masami Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/238,933

(22) Filed: Aug. 17, 2016

(65) Prior Publication Data

US 2017/0062433 A1   Mar. 2, 2017

(30) Foreign Application Priority Data

Aug. 27, 2015   (JP) ................. 2015-167385

(51) Int. Cl.
*H01L 29/10*   (2006.01)
*H01L 29/66*   (2006.01)
*H01L 27/12*   (2006.01)
*H01L 29/786*  (2006.01)
*H01L 27/1156* (2017.01)

(52) U.S. Cl.
CPC ...... *H01L 29/66969* (2013.01); *H01L 27/124* (2013.01); *H01L 27/1225* (2013.01); *H01L 27/1255* (2013.01); *H01L 29/7869* (2013.01); *H01L 29/78645* (2013.01); *H01L 27/1156* (2013.01)

(58) Field of Classification Search
CPC ............. H01L 27/1225; H01L 27/124; H01L 27/1255; H01L 29/78645; H01L 29/66969; H01L 29/7869; G11C 29/021; G11C 29/028; G11C 5/10; G11C 5/06
USPC .......................................................... 257/43
See application file for complete search history.

(56) References Cited

U.S. PATENT DOCUMENTS 7,487,373 B2   2/2009   Koyama
7,851,279 B2   12/2010  Takano et al.
(Continued)

FOREIGN PATENT DOCUMENTS

| JP | 2012-069932 | 4/2012 |
| JP | 2012-146965 | 8/2012 |
| JP | 2013-168631 | 8/2013 |

*Primary Examiner* — Trung Q Dang
(74) *Attorney, Agent, or Firm* — Fish & Richardson P.C.

(57) ABSTRACT

A semiconductor device capable of retaining data for a long time is provided. A semiconductor device includes a first transistor including a first insulator, a first oxide semiconductor, a first gate, and a second gate; a second transistor including a second oxide semiconductor, a third gate, and a fourth gate; and a node. The first gate and the second gate overlap with each other with the first oxide semiconductor therebetween. The third gate and the fourth gate overlap with each other with the second oxide semiconductor therebetween. The first oxide semiconductor and the second gate overlap with each other with the first insulator therebetween. One of a source and a drain of the first transistor, the first gate, and the fourth gate are electrically connected to the node. The first insulator is configured to charges.

22 Claims, 30 Drawing Sheets

(56) References Cited

U.S. PATENT DOCUMENTS

| | | | |
|---|---|---|---|
| 8,421,081 B2 | 4/2013 | Kato et al. | |
| 8,541,846 B2 | 9/2013 | Saito | |
| 8,604,476 B2 | 12/2013 | Kato et al. | |
| 8,737,109 B2 | 5/2014 | Yamazaki et al. | |
| 8,760,959 B2 | 6/2014 | Matsubayashi | |
| 8,907,392 B2 | 12/2014 | Yamazaki et al. | |
| 8,947,158 B2 | 2/2015 | Watanabe | |
| 8,981,367 B2 | 3/2015 | Yoneda et al. | |
| 9,024,317 B2 * | 5/2015 | Endo | G09G 3/3648 257/57 |
| 9,076,505 B2 | 7/2015 | Atsumi et al. | |
| 9,299,848 B2 | 3/2016 | Kato | |
| 9,312,280 B2 | 4/2016 | Kobayashi | |
| 9,337,826 B2 | 5/2016 | Koyama et al. | |
| 9,385,592 B2 | 7/2016 | Watanabe et al. | |
| 9,449,706 B2 | 9/2016 | Yamazaki et al. | |
| 9,501,119 B2 | 11/2016 | Watanabe | |
| 9,509,213 B1 | 11/2016 | Yuan | |
| 2008/0237695 A1 * | 10/2008 | Shino | G11C 11/404 257/324 |
| 2010/0054024 A1 | 3/2010 | La Rosa | |
| 2011/0156025 A1 | 6/2011 | Shionoiri et al. | |
| 2012/0051118 A1 * | 3/2012 | Yamazaki | G11C 16/02 365/149 |
| 2014/0027764 A1 * | 1/2014 | Yamazaki | H01L 27/0688 257/43 |
| 2015/0069387 A1 * | 3/2015 | Yamamoto | H01L 29/7869 257/43 |
| 2015/0171117 A1 | 6/2015 | Endo et al. | |
| 2015/0349130 A1 * | 12/2015 | Tanemura | H01L 29/7869 257/43 |
| 2015/0381036 A1 | 12/2015 | Watanabe et al. | |
| 2016/0043110 A1 | 2/2016 | Atsumi et al. | |
| 2016/0099258 A1 | 4/2016 | Yoneda | |
| 2016/0172010 A1 | 6/2016 | Kato et al. | |
| 2016/0225773 A1 | 8/2016 | Kobayashi | |
| 2016/0248419 A1 | 8/2016 | Koyama et al. | |
| 2016/0336068 A1 | 11/2016 | Yamazaki et al. | |
| 2017/0005659 A1 | 1/2017 | Tamura | |
| 2017/0060217 A1 | 3/2017 | Watanabe | |
| 2017/0179294 A1 | 6/2017 | Kato et al. | |
| 2017/0186749 A1 | 6/2017 | Ohshima et al. | |

* cited by examiner

170

180

FIG. 21A
FIG. 21B
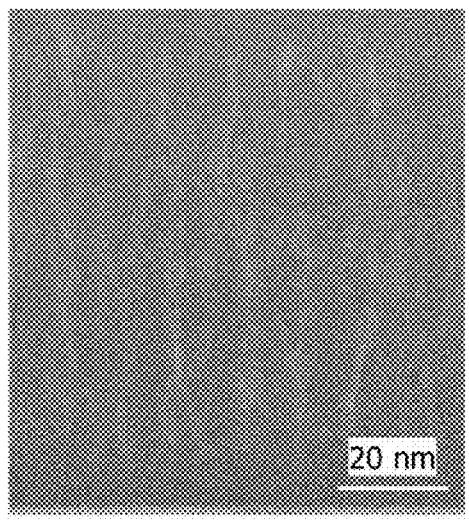
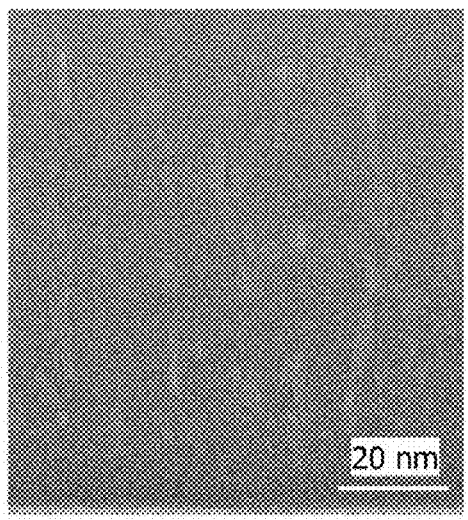

SEMICONDUCTOR DEVICE, STORAGE DEVICE, RESISTOR CIRCUIT, DISPLAY DEVICE, AND ELECTRONIC DEVICE

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a storage device, an imaging device, a processor, and an electronic device. The present invention relates to a method for manufacturing a display device, a liquid crystal display device, a light-emitting device, a storage device, an imaging device, and an electronic device. The present invention relates to a driving method of a semiconductor device, a display device, a liquid crystal display device, a light-emitting device, a storage device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A storage device, a display device, a light-emitting device, a lighting device, an electro-optical device, a semiconductor circuit, and an electronic device include a semiconductor device in some cases.

2. Description of the Related Art

In recent years, a transistor including an oxide semiconductor has attracted attention. Patent Document 1 discloses an example in which a transistor including an oxide semiconductor in a channel formation region (hereinafter referred to as an oxide semiconductor transistor) is used in a dynamic random access memory (DRAM). The oxide semiconductor transistor has extremely low leakage current (also referred to as off-state current) in an off state; thus, a low-power DRAM having a low refresh frequency can be formed.

In Patent Document 2, a nonvolatile memory including an oxide semiconductor transistor is disclosed. Unlike a flash memory, the nonvolatile memory has unlimited cycling capability, consumes less power, and can easily operate at high speed.

Patent Document 2 discloses an example in which an oxide semiconductor transistor has a second gate to control the threshold voltage of the transistor so that the off-state current of the transistor is lowered.

Patent Documents 2 and 3 each disclose a structure example of a circuit for driving the second gate.

REFERENCE

Patent Document

[Patent Document 1] Japanese Published Patent Application No. 2013-168631
[Patent Document 2] Japanese Published Patent Application No. 2012-069932
[Patent Document 3] Japanese Published Patent Application No. 2012-146965

SUMMARY OF THE INVENTION

It is an object of one embodiment of the present invention to provide a semiconductor device capable of retaining data for a long time. It is an object of one embodiment of the present invention to provide a semiconductor device capable of suppressing power consumption. It is an object of one embodiment of the present invention to provide a storage device capable of retaining data for a long time. It is an object of one embodiment of the present invention to provide a storage device capable of suppressing power consumption. It is an object of one embodiment of the present invention to provide a novel semiconductor device.

Note that the description of a plurality of objects does not mutually preclude the existence. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device which includes a first transistor including a first insulator, a first oxide semiconductor, a first gate, and a second gate; a second transistor including a second oxide semiconductor, a third gate, and a fourth gate; and a node. The first gate and the second gate overlap with each other with the first oxide semiconductor therebetween. The third gate and the fourth gate overlap with each other with the second oxide semiconductor therebetween. The first oxide semiconductor and the second gate overlap with each other with the first insulator therebetween. One of a source and a drain of the first transistor, the first gate, and the fourth gate are electrically connected to the node. The first insulator is configured to hold charges.

One embodiment of the present invention is a semiconductor device which includes a first transistor including a first insulator, a first oxide semiconductor, a first gate, and a second gate; a second transistor including a second oxide semiconductor, a third gate, and a fourth gate; a node; and a first input terminal. The first gate and the second gate overlap with each other with the first oxide semiconductor therebetween. The third gate and the fourth gate overlap with each other with the second oxide semiconductor therebetween. The first oxide semiconductor and the second gate overlap with each other with the first insulator therebetween. One of a source and a drain of the first transistor, the first input terminal, and the fourth gate are electrically connected to the node. The first insulator is configured to hold charges.

In one embodiment of the present invention, the semiconductor device further includes a second input terminal electrically connected to the first gate.

In one embodiment of the present invention, the semiconductor device further includes a capacitor electrically connected to the node.

One embodiment of the present invention is the semiconductor device in which the second transistor includes a second insulator, the second oxide semiconductor overlaps with the fourth gate with the second insulator therebetween, and the second insulator is configured to hold holding charges.

One embodiment of the present invention is the semiconductor device in which each of the first oxide semiconductor and the second oxide semiconductor contains one or more elements selected from indium, zinc, and an element M (the element M is aluminum, gallium, yttrium, or tin).

One embodiment of the present invention is the semiconductor device in which each of the first insulator and the second insulator contains one or more elements selected from aluminum, hafnium, gallium, yttrium, and zirconium.

One embodiment of the present invention is a storage device including any one of the above semiconductor devices and a memory element.

One embodiment of the present invention is a register circuit including any one of the above semiconductor devices.

One embodiment of the present invention is a display device including any one of the above semiconductor devices and a display element.

One embodiment of the present invention is an electronic device including any one of the above semiconductor devices and at least one of a microphone, a speaker, a display portion, and an operation key.

According to one embodiment of the present invention, a semiconductor device capable of retaining data for a long time can be provided. According to one embodiment of the present invention, a semiconductor device capable of suppressing power consumption can be provided. According to one embodiment of the present invention, a storage device capable of retaining data for a long time can be provided. According to one embodiment of the present invention, a storage device capable of suppressing power consumption can be provided. According to one embodiment of the present invention, a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 21A and 21B show cross-sectional TEM images of an a-like OS;

DETAILED DESCRIPTION OF THE INVENTION

Figure 1A:
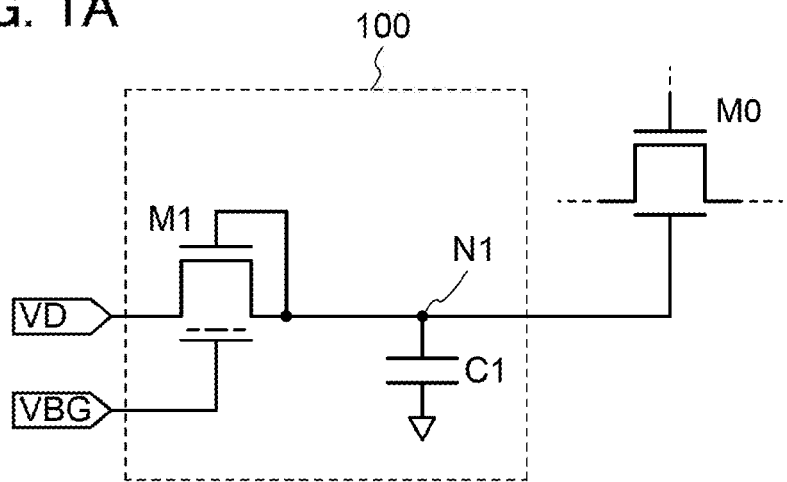
FIGS. 1A to 1C are circuit diagrams each illustrating an example of a semiconductor device.

Hereinafter, embodiment of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in this specification and the like, ordinal numbers such as "first", "second", and the like are used in order to avoid confusion among components and do not limit the number.

Note that in this specification, the description "A has a shape such that an end portion extends beyond an end portion of B" may indicate, for example, the case where at least one of end portions of A is positioned on an outer side of at least one of end portions of B in a top view or a cross-sectional view. Thus, the description "A has a shape such that an end portion extends beyond an end portion of B" can be read as the description "one end portion of A is positioned on an outer side of one end portion of B in a top view," for example.

A voltage usually refers to a potential difference between a given potential and a reference potential (e.g., a ground potential (GND) or a source potential). A voltage can be referred to as a potential and vice versa.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification, trigonal and rhombohedral crystal systems are included in a hexagonal crystal system.

In this specification, a term "semiconductor" can be referred to as an "oxide semiconductor". As the semiconductor, a Group 14 semiconductor such as silicon or germanium; a compound semiconductor such as silicon carbide, germanium silicide, gallium arsenide, indium phosphide, zinc selenide, or cadmium sulfide; a carbon nanotube; graphene; or an organic semiconductor can be used.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions that are just examples. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a circuit structure of a semiconductor device of one embodiment of the present invention is described.

FIG. 1A is a circuit diagram of a semiconductor device of one embodiment of the present invention. A circuit 100 illustrated in FIG. 1A has a circuit structure of a semiconductor device for driving a second gate of a transistor M0. The semiconductor device illustrated in FIG. 1A includes an input terminal VBG, an input terminal VD, the transistor M0 including first and second gates, and the circuit 100 electrically connected to the second gate of the transistor M0.

The circuit 100 includes a transistor M1, a node N1, and a capacitor C1. The transistor M1 includes an insulator (also referred to as a charge trap layer) that has a function of holding (or capturing) charges. The charge trap layer is provided between a semiconductor and a second gate. A transistor including such a charge trap layer is denoted as the transistor M1 (the charge trap layer is indicated by dotted lines in the figures) as illustrated in FIG. 1A. The threshold voltage of the transistor can be shifted in the positive direction when electrons are held in the charge trap layer as charges, for example. Furthermore, the threshold voltage of the transistor can be shifted in the negative direction when holes are held in the charge trap layer as charges.

The second gate of the transistor M0 has a function of controlling the threshold voltage $V_{th}$ of the transistor M0. For example, in the case where the transistor M0 is an n-channel transistor, $V_{th}$ of the transistor M0 can be shifted in a positive direction and off-state current at $V_{gs}$=0 V can be reduced (i.e., the transistor M0 can be normally-off) by application of a potential lower than a source potential to the second gate of the transistor M0. In contrast, $V_{th}$ of the transistor M0 can be shifted in a negative direction and on-state current can flow at $V_{gs}$=0 V (i.e., the transistor M0 can be normally-on) by application of a potential higher than the source potential to the second gate of the transistor M0.

The first and second gates of the transistor M0 overlap with each other with a semiconductor layer therebetween.

A first gate of the transistor M1 is electrically connected to the node N1. A second gate of the transistor M1 is electrically connected to the input terminal VBG. One of a source and a drain of the transistor M1 is electrically connected to the node N1. The other of the source and the drain of the transistor M1 is electrically connected to the input terminal VD.

A first terminal of the capacitor C1 is electrically connected to the node N1, and a constant low potential is applied to a second terminal of the capacitor C1. A ground potential may be applied as the low potential.

The second gate of the transistor M0 is electrically connected to the node N1.

The channel length or the channel width of the transistor M0 is preferably shorter than that of the transistor M1. The transistor M0 is used in a portion which does not need a high withstand voltage and the transistor M1 is used in a portion which needs a high withstand voltage.

The transistor M0 and the transistor M1 may be formed in the same plane. A layer including the transistor M1 may be stacked over a layer including the transistor M0; alternatively, the layers may be reversely stacked.

Note that each of the transistor M0 and the transistor M1 may have the charge trap layer; alternatively, only the transistor M1 may have the charge trap layer.

The transistor M1 and the transistor M0 preferably have low off-state current. For example, the off-state current of the transistors M1 to M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

Unless otherwise specified, the off-state current in this specification refers to a drain current of a transistor in the off state (also referred to as non-conduction state and cutoff state). Unless otherwise specified, the off state of an n-channel transistor means that $V_{gs}$ is smaller than $V_{th}$, and the off state of a p-channel transistor means that $V_{gs}$ is larger than $V_{th}$. For example, the off-state current of an n-channel transistor sometimes refers to a drain current that flows when $V_{gs}$ is lower than $V_{th}$. The off-state current of a transistor depends on $V_{gs}$ in some cases. Thus, "the off-state current of a transistor is lower than or equal to $10^{-21}$ A" may mean "there is $V_{gs}$ with which the off-state current of the transistor becomes lower than or equal to $10^{-21}$ A". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

In this specification, the off-state current of a transistor with channel width W is sometimes represented by a current value per channel width or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.).

The off-state current of a transistor depends on a voltage $V_{ds}$ between its drain and source in some cases. Unless otherwise specified, the off-state current in this specification may be an off-state current at $V_{ds}$ with an absolute value of 0.1 V, 0.8 V, 1.0 V, 1.2 V, 1.8 V, 2.5 V, 3.0 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like including the transistor.

Figure 1B:
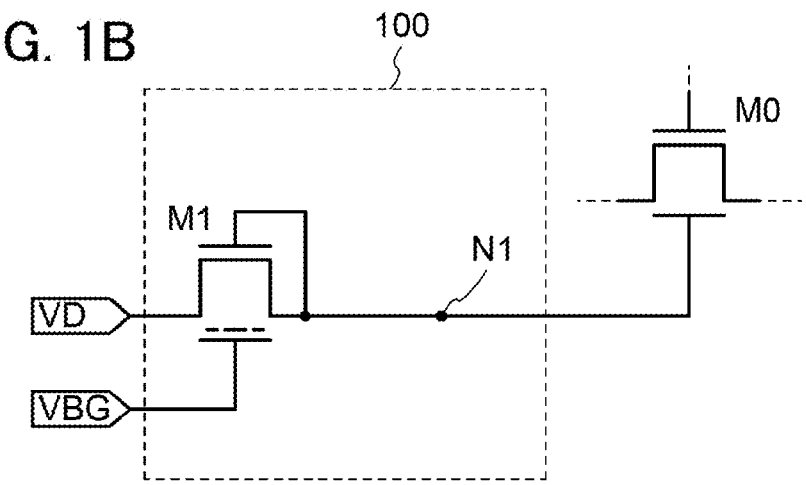

As illustrated in FIG. 1B, the circuit 100 in FIG. 1A may have a structure in which the capacitor C1 is omitted. In that case, charges may be held in the node N1.

Figure 1C:
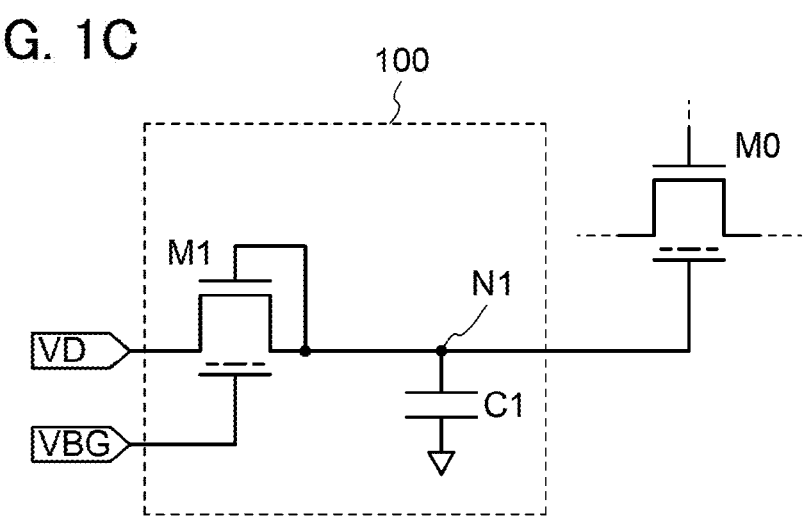

As illustrated in FIG. 1C, the transistor M0 in FIG. 1A may have a charge trap layer as in the transistor M1.

Figure 2A:
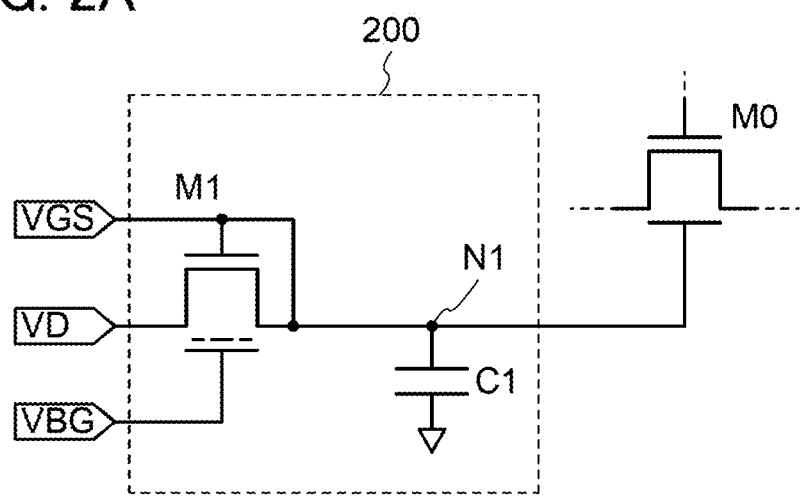
FIGS. 2A and 2B are circuit diagrams each illustrating an example of a semiconductor device.

As illustrated in FIG. 2A, the semiconductor device may include an input terminal VGS electrically connected to the first gate of the transistor M1 illustrated in FIG. 1A. Unlike the transistor M1 illustrated in FIG. 1A, the second gate of the transistor M1 is not electrically connected to the node N1 in the structure of FIG. 2A. Thus, the potentials of the source and the drain of the transistor M1 can be fixed. Accordingly, charges can be efficiently injected into the charge trap layer of the transistor M1, for example.

Figure 2B:
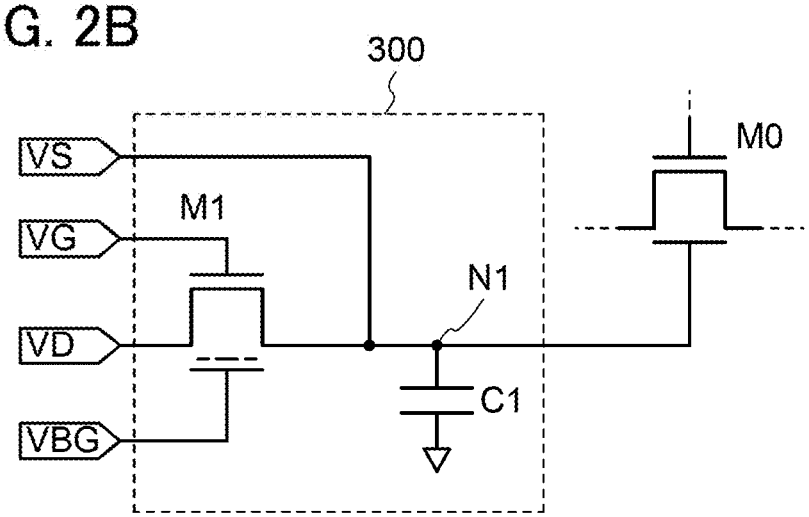

As illustrated in FIG. 2B, the semiconductor device may include an input terminal VG electrically connected to the first gate of the transistor M1 in FIG. 1A and an input terminal VS electrically connected to the one of the source and the drain of the transistor M1 and the node N1. Thus, when charges are injected into the charge trap layer of the transistor M1, for example, a voltage can be applied to the input terminal VBG with the transistor M1 on. Thus, charge injection can be efficiently performed.

The above-described structures can be combined as appropriate.

Next, the operation of the circuit 100 illustrated in FIG. 1A will be described with reference to FIGS. 3A to 3C and FIGS. 4A and 4B. Note that the transistors M0 and M1 are described as n-channel transistors.

An example of the case where −5 V is written into the second gate of the transistor M0 is illustrated in FIGS. 3A to 3C and FIGS. 4A and 4B. Note that the voltage value in this embodiment is just an example and is not limited to this. For example, the voltage value is changed as appropriate in accordance with the size of the transistor or the threshold voltage thereof.

Figure 3A:
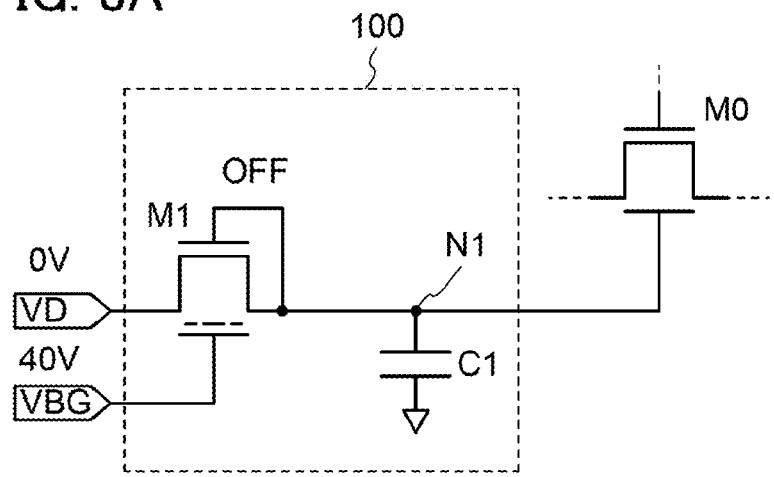
FIGS. 3A to 3C are circuit diagrams illustrating an operation example of a semiconductor device.

First, as illustrated in FIG. 3A, 40 V is applied to the input terminal VBG while the input terminal VD is held at 0 V, whereby charges (here, electrons that are negative charges) are injected into the charge trap layer of the transistor M1. At this time, the transistor M1 is in an off state. The electrons are injected into the charge trap layer of the transistor M1 and held, so that the threshold voltage of the transistor M1 can be shifted in the positive direction. Accordingly, the transistor M1 that is an n-channel transistor can have normally-off characteristics.

Figure 3B:
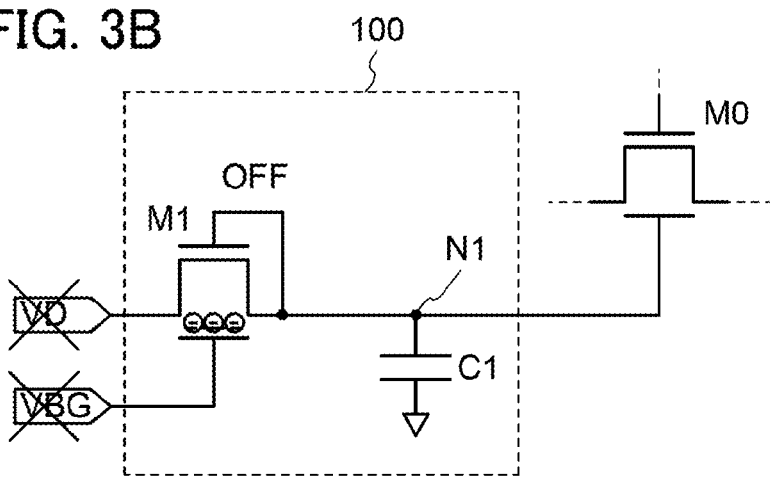

Next, the input terminal VD and the input terminal VBG are electrically unconnected (such a state is also referred to as "floating") as illustrated in FIG. 3B, whereby charge injection and charge retention into/of the charge trap layer of the transistor M1 are completed. Note that charges (here, electrons) are schematically shown in the figures for easy understanding.

Figure 3C:
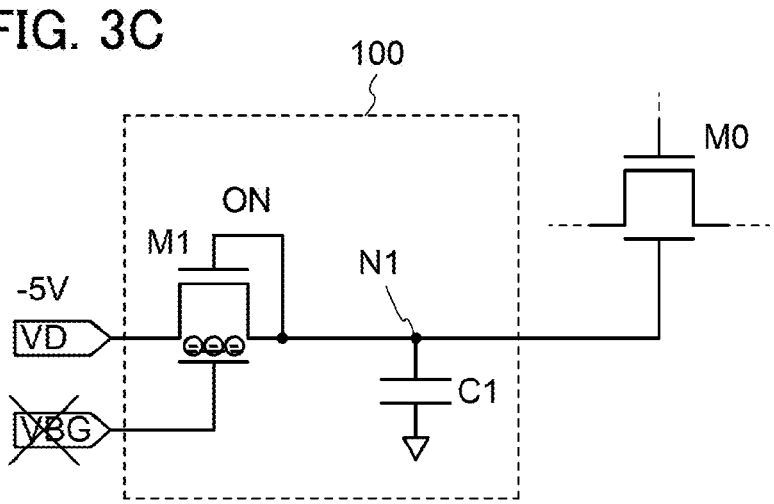

Next, as illustrated in FIG. 3C, −5 V is applied to the input terminal VD, whereby the transistor M1 is turned on. Thus, charges are supplied from the input terminal VD to the node N1 and the capacitor C1.

Figure 4A:
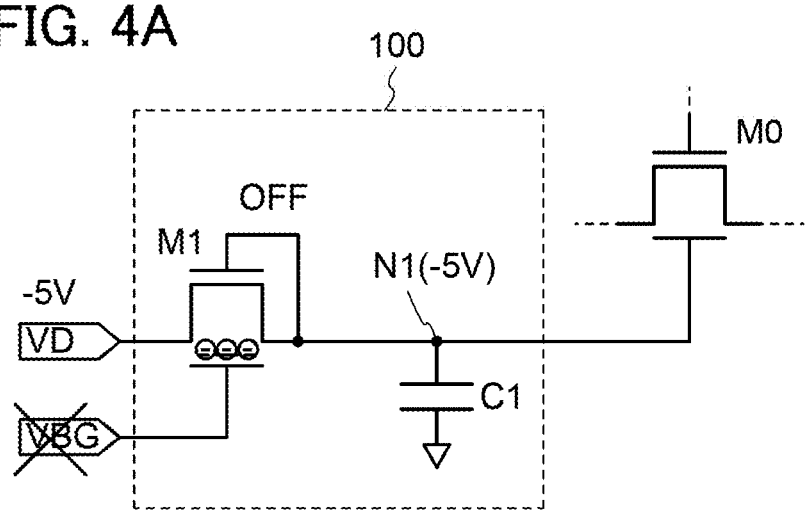
FIGS. 4A and 4B are circuit diagrams illustrating the operation example of the semiconductor device.

As illustrated in FIG. 4A, the potential of the node N1 is substantially the same as that of the input terminal VD; thus, the transistor M1 is turned off.

Figure 4B:
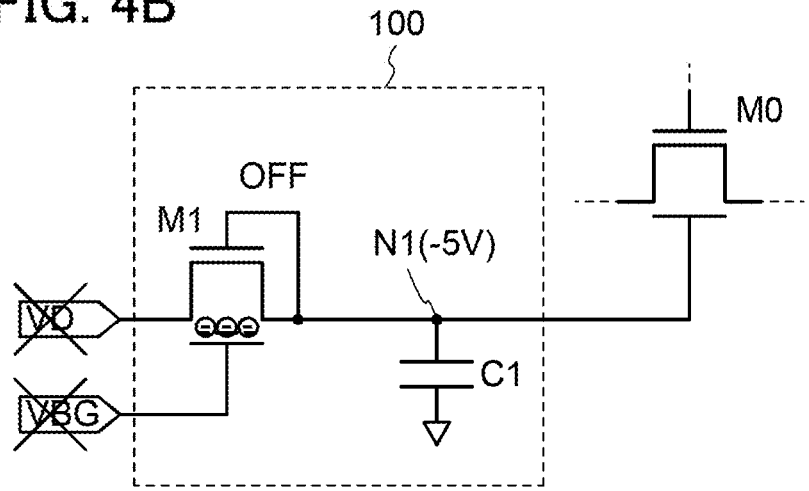

Next, the writing operation of −5 V into the second gate of the transistor M0 is completed with the input terminal VD electrically unconnected as illustrated in FIG. 4B.

The semiconductor device of this embodiment has a structure in which the charge trap layer is provided for the transistor M1 in the circuit 100 for charging the capacitor C1 that is applied to the second gate of the transistor M0. Thus, the semiconductor device in which the threshold voltage of a minute transistor can be controlled at a low voltage and which can be controlled for a long time can be manufactured. For example, the semiconductor device can have the following structure. The transistor M1 in the circuit 100 is a transistor which can withstand a high voltage, and the transistor M0 used as a memory element or the like is a minute transistor.

As described above, it is necessary to apply a relatively high voltage to inject charges into the charge trap layer of the transistor M1. Thus, the transistor M1 is preferably a transistor with a high withstand voltage in the circuit 100 for charging the capacitor C1 that is applied to the second gate of the transistor M0. It is not necessary that the transistor M0 functioning as a memory element be a transistor with a high withstand voltage, and it is preferable that the transistor M0 be a minute transistor.

Next, the operation of a circuit 200 illustrated in FIG. 2A is described with reference to FIGS. 5A to 5C and FIGS. 6A and 6B. Note that the transistor M0 and the transistor M1 are described as n-channel transistors.

Figure 5A:
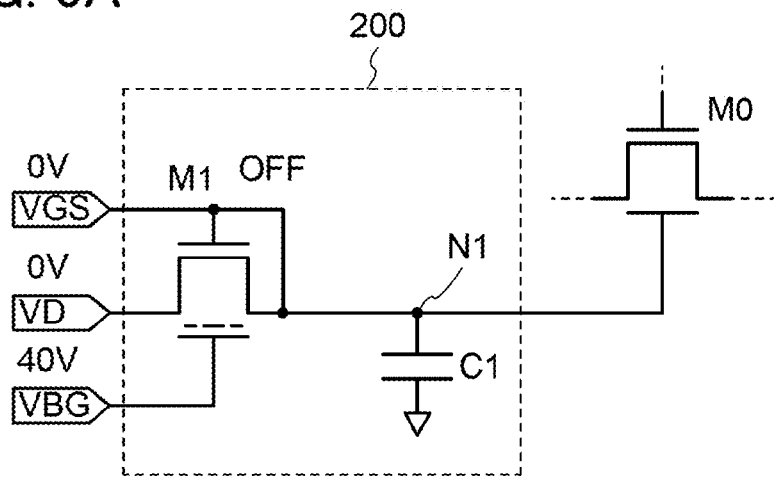
FIGS. 5A to 5C are circuit diagrams illustrating an operation example of a semiconductor device.

As in the above, an example of the case where −5 V is written into the second gate of the transistor M0 is described with reference to FIGS. 5A to 5C and FIGS. 6A and 6B. First, as illustrated in FIG. 5A, 40 V is applied to the input terminal VBG while the input terminal VGS and the input terminal VD are held at 0V, so that charges (here, electrons that are negative charges) are injected into the charge trap layer of the transistor M1. Note that the transistor M1 is in an off state. The electrons are injected into the charge trap layer of the transistor M1 and held, whereby the threshold voltage of the transistor M1 can be shifted in the positive direction. Thus, the transistor M1 that is an n-channel transistor can have normally-off characteristics.

Figure 5B:
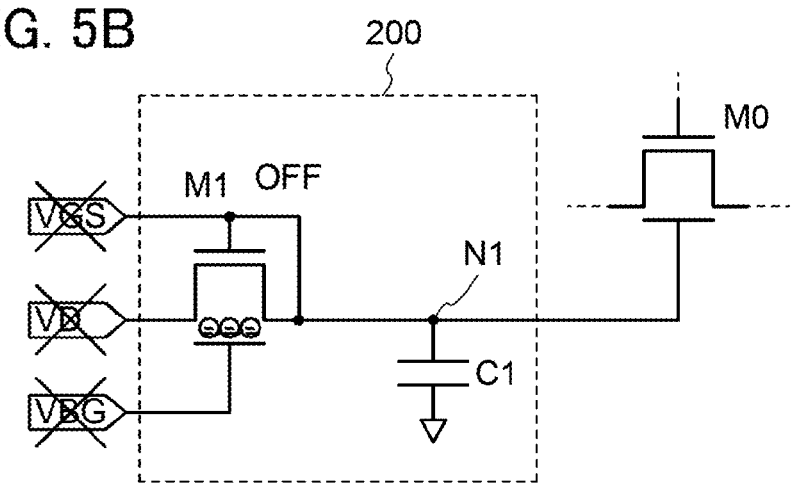

Next, the input terminal VGS, the input terminal VD, and the input terminal VBG are electrically unconnected (such a state is also referred to as "floating") as illustrated in FIG. 5B, whereby charge injection and charge retention into/of the charge trap layer in the transistor M1 are completed.

Figure 5C:
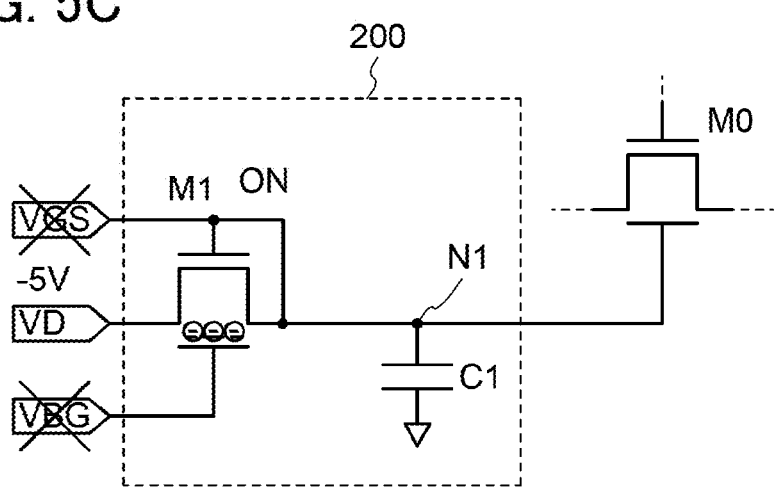

Next, as illustrated in FIG. 5C, −5 V is applied to the input terminal VD, so that the transistor M1 is turned on. Accordingly, charges are supplied from the input terminal VD to the node N1 and the capacitor C1.

Figure 6A:
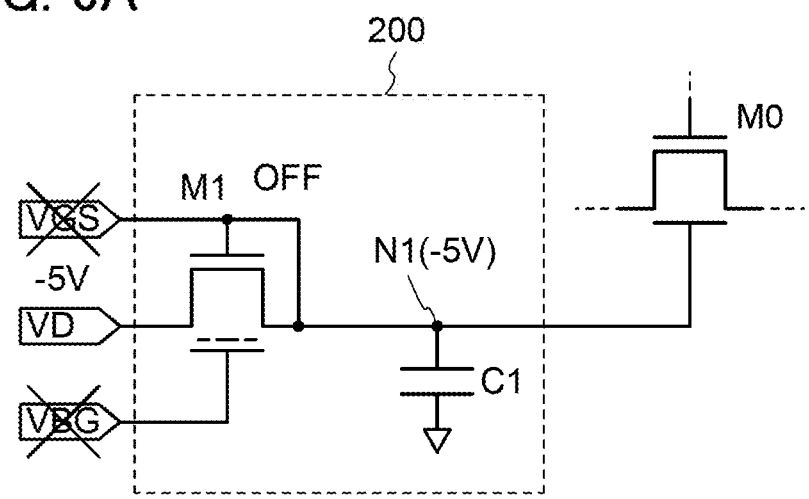
FIGS. 6A and 6B are circuit diagrams illustrating the operation example of the semiconductor device.

Next, as illustrated in FIG. 6A, the potential of the node N1 is substantially the same as that of the input terminal VD; thus, the transistor M1 is turned off.

Figure 6B:
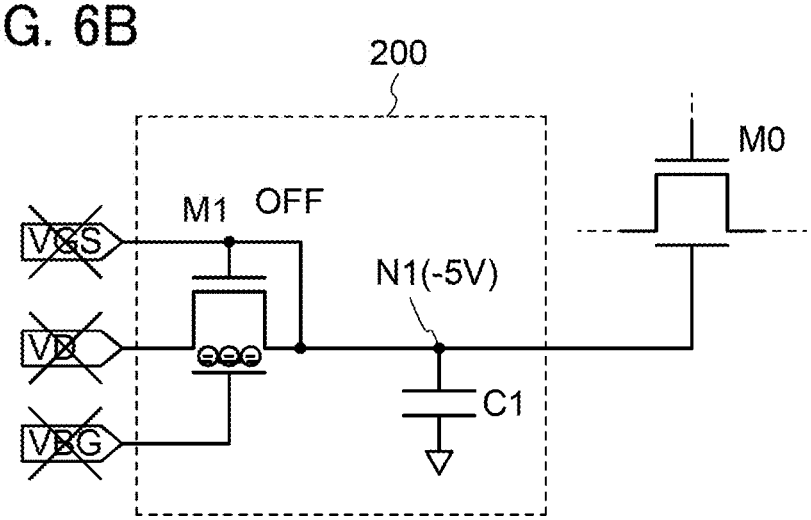

Next, as illustrated in FIG. 6B, the input terminal VD is electrically unconnected, whereby the writing operation of −5 V into the second gate of the transistor M0 is completed.

Next, the operation of a circuit 300 illustrated in FIG. 2B is described with reference to FIGS. 7A to 7C and FIGS. 8A and 8B. Note that the transistor M0 and the transistor M1 are described as n-channel transistors.

Figure 7A:
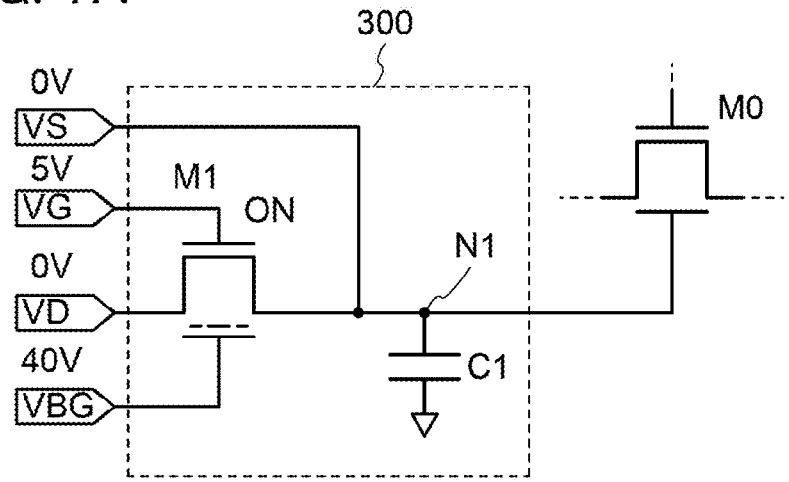
FIGS. 7A to 7C are circuit diagrams illustrating an operation example of a semiconductor device.

As in the above, an example of the case where −5 V is written into the second gate of the transistor M0 is described with reference to FIGS. 7A to 7C and FIGS. 8A and 8B. First, as illustrated in FIG. 7A, a voltage at which the transistor M1 is turned on (e.g., 5 V) is applied to the input terminal VG while the input terminal VS and the input terminal VD are held at 0V. Accordingly, the transistor M1 is turned on. Then, 40 V is applied to the input terminal VBG, so that charges (here, electrons that are negative charges) are injected into the charge trap layer of the transistor M1. The electrons are injected into the charge trap layer of the transistor M1 and held, whereby the threshold voltage of the transistor M1 can be shifted in the positive direction. Thus, the transistor M1 that is an n-channel transistor can have normally-off characteristics.

Figure 7B:
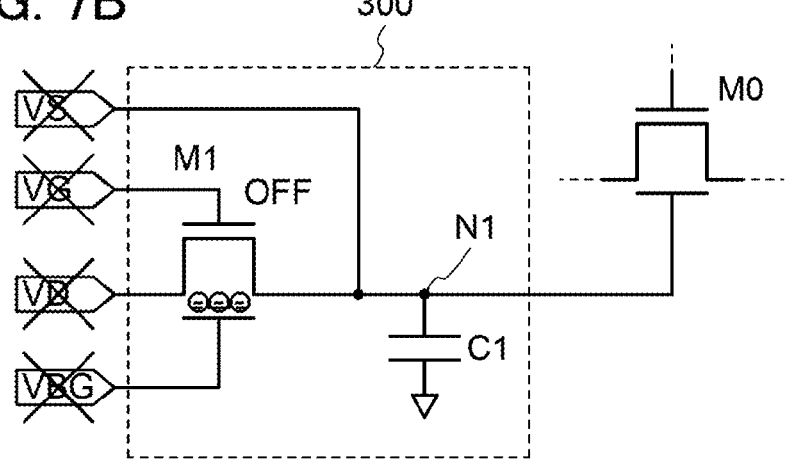

Next, the input terminal VS, the input terminal VG, the input terminal VD, and the input terminal VBG are electrically unconnected (such a state is also referred to as "floating") as illustrated in FIG. 7B, whereby charge injection and charge retention into/of the charge trap layer in the transistor M1 are completed.

Figure 7C:
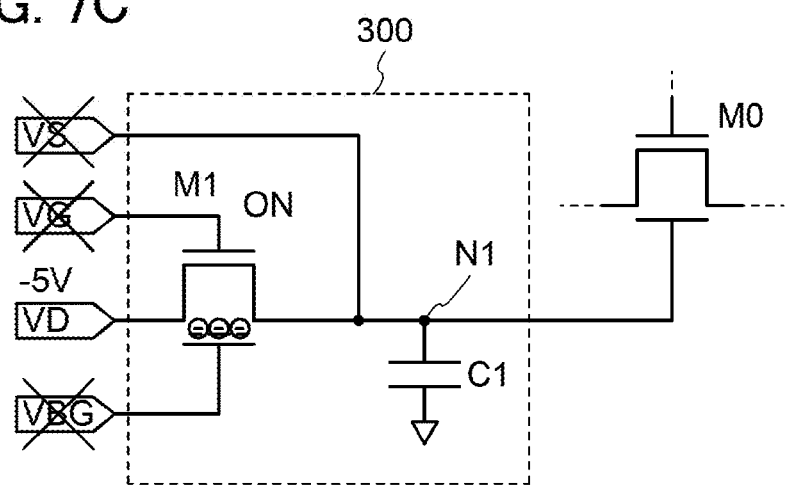

Next, as illustrated in FIG. 7C, −5 V is applied to the input terminal VD, so that the transistor M1 is turned on. Accordingly, charges are supplied from the input terminal VD to the node N1 and the capacitor C1.

Figure 8A:
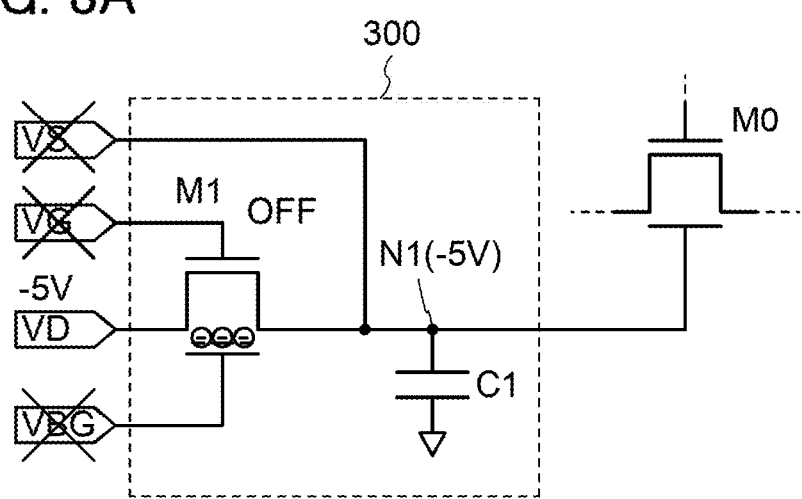
FIGS. 8A and 8B are circuit diagrams illustrating an operation example of the semiconductor device.

Next, as illustrated in FIG. 8A, the potential of the node N1 is substantially the same as that of the input terminal VD; thus, the transistor M1 is turned off.

Figure 8B:
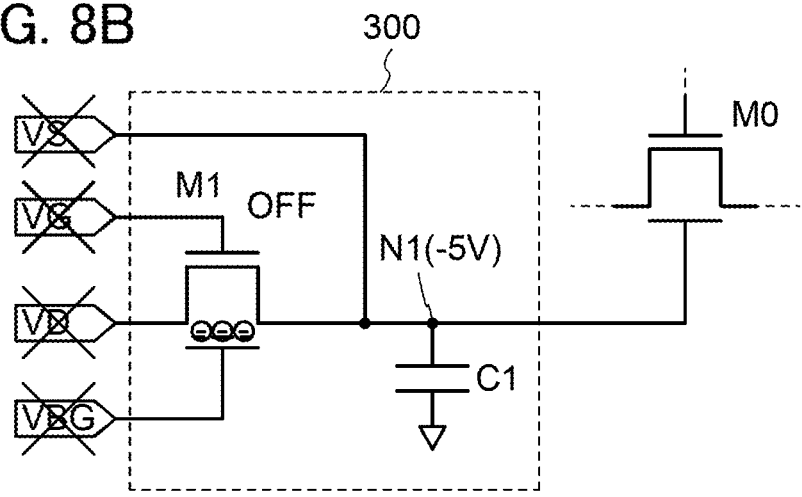

Next, as illustrated in FIG. 8B, the input terminal VD is electrically unconnected, whereby the writing operation of −5 V into the second gate of the transistor M0 is completed.

The structures, the methods, and the like described in this embodiment can be combined as appropriate with any of the structures, the methods, and the like described in the other embodiments.

Embodiment 2

In this embodiment, application examples of the circuit 100 described in Embodiment 1 are described with reference to FIGS. 9A and 9B, FIGS. 10A and 10B, FIG. 11, and FIGS. 12A and 12B. Note that the circuit 200 or the circuit 300 may be used instead of the circuit 100.

<Nonvolatile Memory>

Figure 9A:
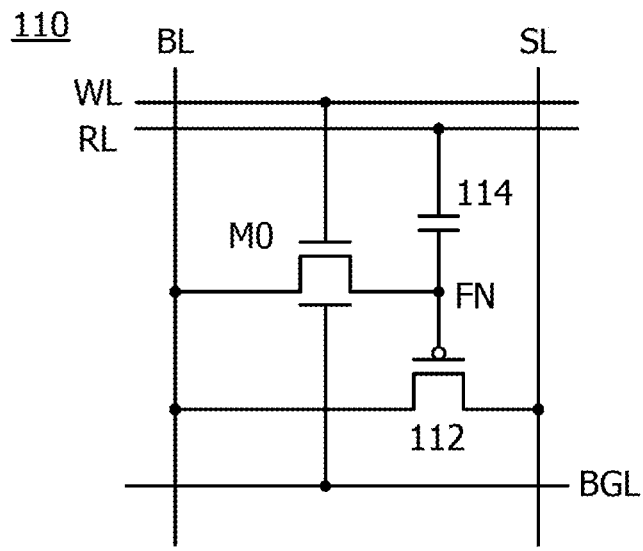
FIGS. 9A and 9B are circuit diagrams each illustrating a circuit structure example of a nonvolatile memory.

FIG. 9A illustrates a circuit structure of a memory cell 110 functioning as a memory element.

The memory cell 110 illustrated in FIG. 9A includes the transistor M0 including the first and second gates, a transistor 112, a capacitor 114, a node FN, a wiring BL, a wiring SL, a wiring WL, a wiring RL, and a wiring BGL.

In the memory cell 110 illustrated in FIG. 9A, the first gate of the transistor M0 is electrically connected to the wiring WL; the second gate of the transistor M0 is electrically connected to the wiring BGL; one of a source and a drain of the transistor M0 is electrically connected to the wiring BL; and the other of the source and the drain of the transistor M0 is electrically connected to the node FN.

In the memory cell 110 illustrated in FIG. 9A, a gate of the transistor 112 is electrically connected to the node FN; one of a source and a drain of the transistor 112 is electrically connected to the wiring BL; and the other of the source and the drain of the transistor 112 is electrically connected to the wiring SL.

In the memory cell 110 illustrated in FIG. 9A, a first terminal of the capacitor 114 is electrically connected to the wiring RL, and a second terminal of the capacitor 114 is electrically connected to the node FN.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

The transistor 112 preferably has little variation in the threshold voltage. Specifically, a transistor including single crystal silicon in its channel is preferably used.

The memory cell 110 utilizes a characteristic in which the charge of the node FN can be held, so that data can be written, retained, and read as follows.

Data writing and data retention are described. First, a potential is applied to the wiring WL so that the transistor M0 is turned on. Accordingly, the potential of the wiring BL is applied to the node FN. That is, predetermined charge is supplied to the node FN (writing). Here, charge for applying either of two different potential levels (hereinafter referred to as a low level and a high level) is given. After that, the transistor M0 is turned off, so that the charge given to the node FN is held (storing).

Since the off-state current of the transistor M0 is extremely low, the charge of the node FN is held for a long time.

Next, data reading is described. An appropriate potential (reading potential) is applied to the wiring RL while a predetermined potential (constant potential) is applied to the wiring SL, so that the potential of the wiring BL varies depending on the amount of charge held in the gate of the transistor 112. This is because in the case where the transistor 112 is a p-channel transistor, an apparent threshold voltage $V_{th\_H}$ when a high level is supplied to the node FN is usually lower than the apparent threshold voltage $V_{th\_L}$ when a low level is supplied to the node FN. Here, the apparent threshold voltage refers to the potential of the wiring RL that is needed to turn on the transistor 112. Thus, when the potential of the wiring RL is set to a potential $V_0$ that is between $V_{th\_H}$ and $V_{th\_L}$, charge given to the gate of the transistor 112 can be determined. For example, in the case where the low level is supplied in data writing, the transistor 112 is turned on when the potential of the node FN is $V_0$ ($<V_{th\_L}$). In the case where the high-level charge is supplied in data writing, the transistor 112 remains in an off state even when the potential of the node FN is set to $V_0$ ($>V_{th\_H}$). Therefore, the retained data can be read by determining the potential of the wiring BL.

Note that although the transistor 112 is a p-channel transistor in the above description, one embodiment of the present invention is not limited thereto. The transistor 112 might be an n-channel transistor.

Figure 9B:
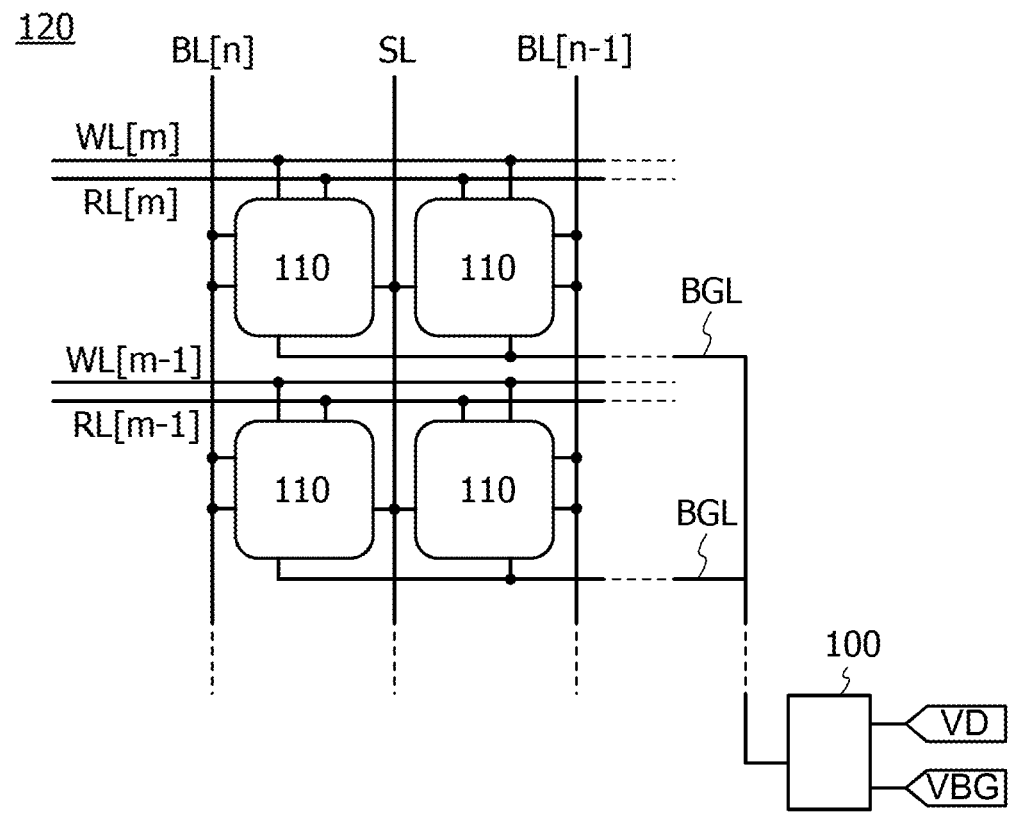

FIG. 9B illustrates the circuit structure of a storage device 120 including the memory cells 110 arranged in a matrix and the circuit 100 described in Embodiment 1. The storage device 120 functions as a nonvolatile memory.

The storage device 120 includes the memory cells 110 arranged in a matrix of m rows and n columns. Here, m and n are each a natural number of 2 or more. The memory cells 110 provided in an m-th row are electrically connected to wirings WL[m] and RL[m], and the memory cells 110 provided in an n-th column are electrically connected to a wiring BL[n] and the wiring SL.

The second gates of the transistors M0 included in the memory cells 110 are electrically connected to the circuit 100 through the wirings BGL. In other words, the circuit 100 has a function of supplying signals for controlling the second gates of the transistors M0 included in all the memory cells.

When the circuit 100 controls the second gate of the transistor M0, the transistor M0 can have appropriate $V_{th}$ and can be prevented from being normally-on. Consequently, the off-state current of the transistor M0 can be reduced, and the transistor M0 can easily hold charge given to the node FN.

When the storage device 120 has such a structure, it is possible to provide a storage device capable of retaining data for a long time even after the storage device is powered off.

<DRAM>

Figure 10A:
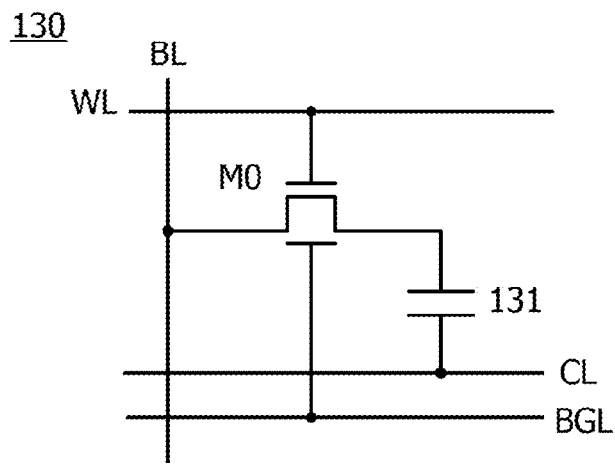
FIGS. 10A and 10B are circuit diagrams each illustrating a circuit structure example of a DRAM.

FIG. 10A illustrates the circuit structure of a memory cell 130 functioning as a memory element.

The memory cell 130 illustrated in FIG. 10A includes the transistor M0 including the first and second gates, a capacitor 131, the wiring BL, the wiring WL, a wiring CL, and the wiring BGL.

In the memory cell 130 illustrated in FIG. 10A, the first gate of the transistor M0 is electrically connected to the wiring WL; the second gate of the transistor M0 is electrically connected to the wiring BGL; one of the source and the drain of the transistor M0 is electrically connected to the wiring BL; and the other of the source and the drain of the transistor M0 is electrically connected to a first terminal of the capacitor 131. A second terminal of the capacitor 131 is electrically connected to the wiring CL.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

The wiring WL has a function of supplying signals for controlling the on/off state of the transistor M0, and the wiring BL has a function of giving charge to the capacitor 131 through the transistor M0. By turning off the transistor M0 after charge is given to the capacitor 131, the charge given to the capacitor 131 can be held.

Since the charge given to the capacitor 131 leaks to the outside through the transistor M0, operation of rewriting (refreshing) the charge given to the capacitor 131 at regular intervals is needed. However, the refresh frequency is low because the off-state current of the transistor M0 is extremely low and the amount of charge that leaks from the capacitor 131 is small.

Figure 10B:
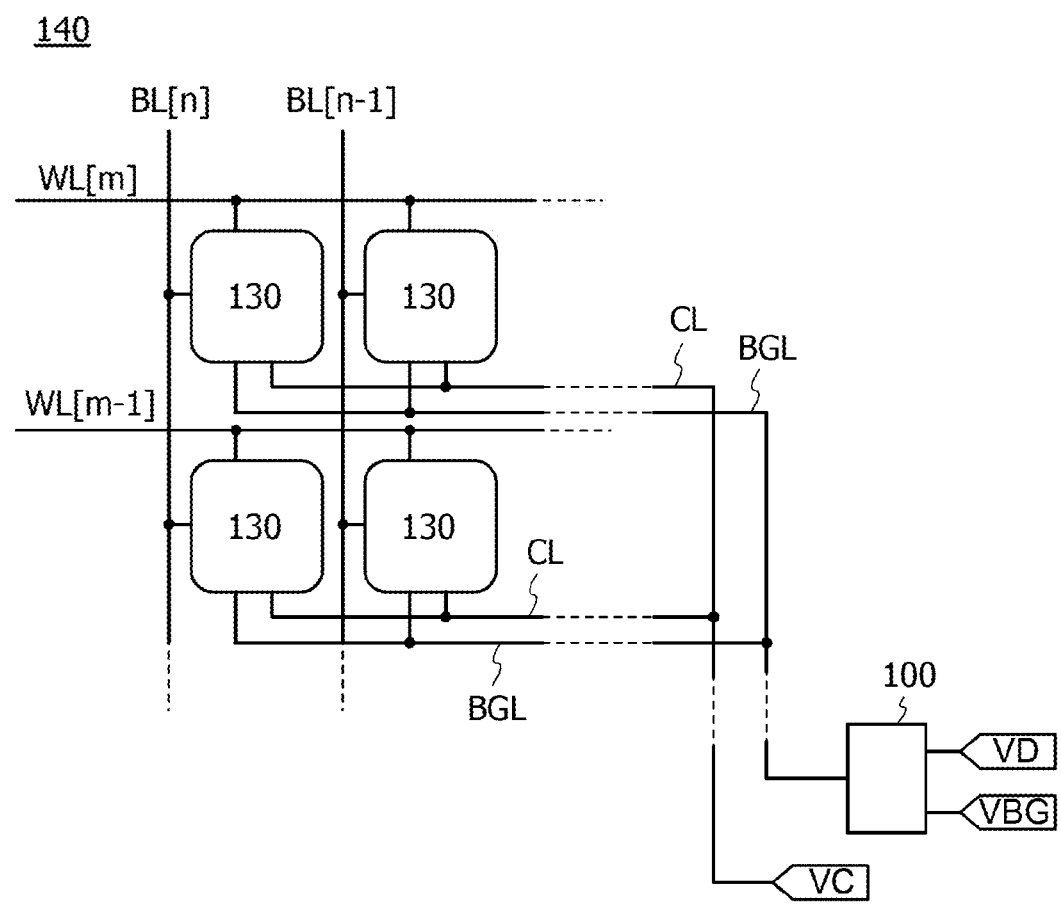

FIG. 10B illustrates the circuit structure of a storage device 140 including the memory cells 130 arranged in a matrix and the circuit 100 described in Embodiment 1. The storage device 140 functions as a DRAM.

The storage device 140 includes the memory cells 130 arranged in a matrix of m rows and n columns. The memory cells 130 provided in the m-th row are electrically connected to the wiring WL[m], and the memory cells 130 provided in the n-th column are electrically connected to the wiring BL[n]. The wiring CL is electrically connected to a terminal VC for applying a constant low potential.

The second gates of the transistors M0 included in the memory cells 130 are electrically connected to the circuit 100 through the wirings BGL. In other words, the circuit 100 has a function of supplying signals for controlling the second gates of the transistors M0 included in all the memory cells.

When the circuit 100 controls the second gate of the transistor M0, the transistor M0 can have appropriate $V_{th}$ and can be prevented from being normally-on, for example. Consequently, the off-state current of the transistor M0 can be reduced, and the transistor M0 can hold charge given to the capacitor 131.

When the storage device 140 has such a structure, it is possible to provide a storage device capable of operating at low power with infrequent refresh operation.

<Register>

Figure 11:
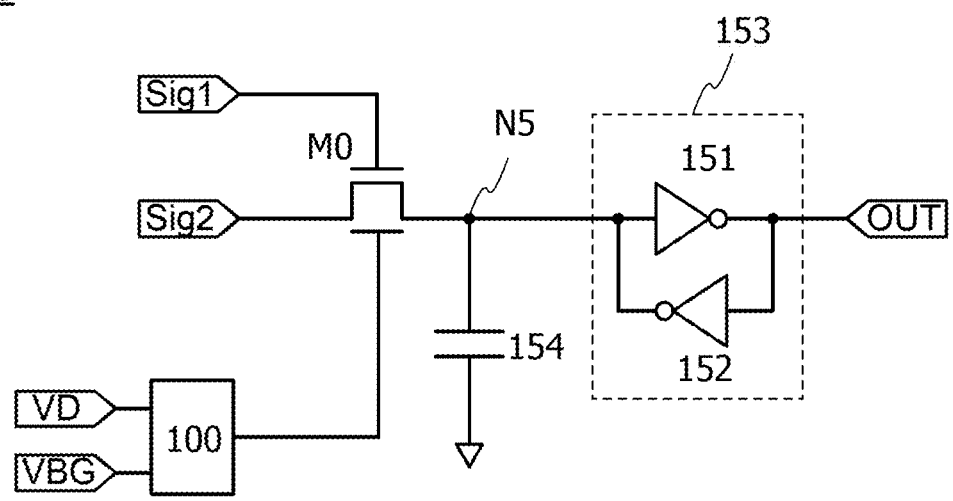
FIG. 11 is a circuit diagram illustrating a circuit structure example of a register.

FIG. 11 illustrates a structure example of a 1-bit register circuit 150.

The register circuit 150 includes the transistor M0 including the first and second gates, a capacitor 154, a node N5, and a flip-flop circuit 153.

The flip-flop circuit 153 includes inverters 151 and 152. The inverter 151 whose direction is opposite to the direction of the inverter 152 is connected in parallel with the inverter 152, and a node to which an output side of the inverter 151 is connected corresponds to an output terminal OUT of the register circuit 150.

The second gate of the transistor M0 is electrically connected to the circuit 100; the first gate of the transistor M0 is electrically connected to an input terminal Sig1; one of the source and the drain of the transistor M0 is electrically connected to an input terminal Sig2; and the other of the source and the drain of the transistor M0 is electrically connected to the node N5.

A first terminal of the capacitor 154 is electrically connected to the node N5, and a constant low potential is applied to a second terminal of the capacitor 154. The ground potential may be applied as the low potential. The node N5 is electrically connected to the flip-flop circuit 153.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

The register circuit 150 stores and outputs data with input signals from the input terminals Sig1 and Sig2. For example, when high-level voltages are input from the input terminals Sig1 and Sig2, the transistor M0 is turned on, so that a high-level voltage is input to the node N5. Accordingly, a low-level voltage obtained by inversion in the inverter 151 is output from the output terminal OUT of the register circuit 150, and at the same time, data of the low-level voltage is stored in the flip-flop circuit 153. In contrast, when a low-level voltage is input from the input terminal Sig2, a high-level voltage is output from the output terminal OUT similarly, and data of the high-level voltage is stored in the flip-flop circuit 153.

The capacitor 154 has a function of holding the voltage of the node N5.

The register circuit 150 can hold the potential of the node N5 even if supply of a power supply voltage is stopped by turning off the transistor M0 after a potential is applied from the input terminal Sig2 to the node N5. This is because the off-state current of the transistor M0 is extremely low. In other words, by using the register circuit 150, it is possible to provide a storage device that can retain data even after supply of a power supply voltage is stopped.

The circuit 100 has a function of supplying signals for controlling the second gate of the transistor M0. When the circuit 100 controls the second gate of the transistor M0, the transistor M0 can have appropriate $V_{th}$ and can be prevented from being normally-on, for example. Consequently, the off-state current of the transistor M0 can be reduced, and the transistor M0 can hold charge given to the node N5.

Note that in this embodiment, a simple structure of two inverter circuits is described as an example of the flip-flop circuit 153; however, one embodiment of the present invention is not limited to this structure. A clocked inverter capable of performing clock operation or a structure in which a NAND circuit and an inverter are combined can be used as appropriate. For example, a known flip-flop circuit such as an RS flip-flop circuit, a JK flip-flop circuit, a D flip-flop circuit, or a T flip-flop circuit can be used as appropriate.

<Display Device>

Figure 12A:
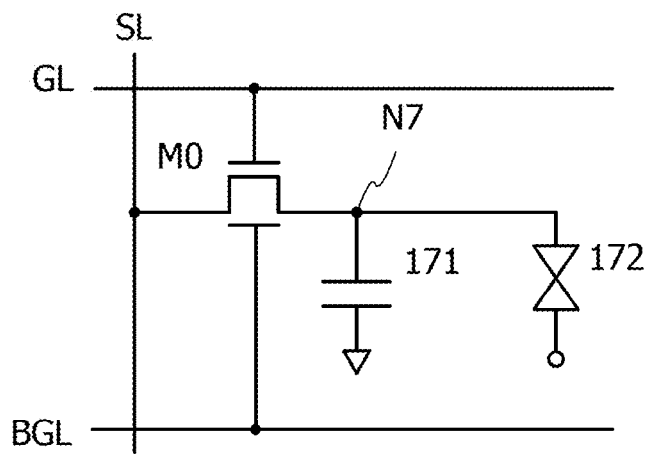
FIGS. 12A and 12B are circuit diagrams each illustrating a circuit structure example of a display device.
Figure 12B:
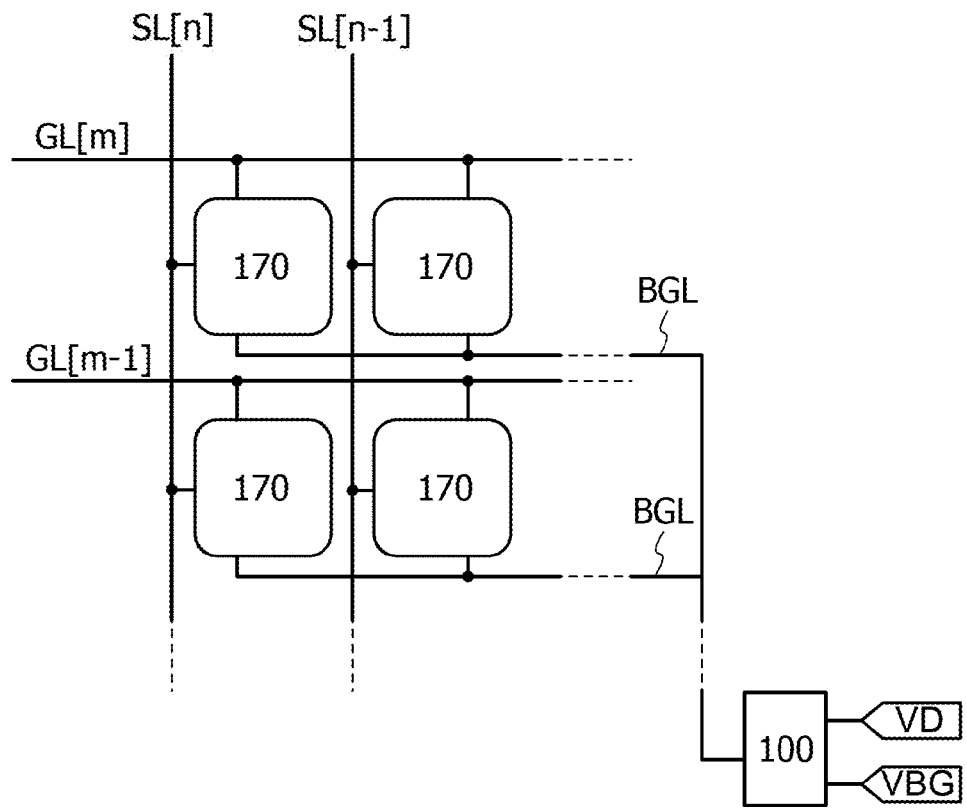

FIGS. 12A and 12B each illustrate an example in which the circuit 100 in Embodiment 1 is used in a display device.

FIG. 12A illustrates a structure example of a pixel 170 that can be used in a display device. The pixel 170 includes the transistor M0 including the first and second gates, a capacitor 171, a display element 172, a node N7, a wiring GL, the wiring SL, and the wiring BGL.

The first gate of the transistor M0 is electrically connected to the wiring GL; the second gate of the transistor M0 is electrically connected to the wiring BGL; one of the source and the drain of the transistor M0 is electrically connected to the wiring SL; and the other of the source and the drain of the transistor M0 is electrically connected to the node N7.

A first terminal of the capacitor 171 is electrically connected to the node N7, and a constant low potential is applied to a second terminal of the capacitor 171.

The capacitor 171 may be provided as needed. In the case where parasitic capacitance of an electrode, a wiring, or the like can be used as capacitance needed to drive the pixel 170, the capacitor 171 may be omitted.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

A first terminal of the display element 172 is electrically connected to the node N7, and a constant low potential is applied to a second terminal of the display element 172. The ground potential may be applied as the low potential. A dielectric element whose optical characteristics are changed when a voltage is applied to its electrodes at opposite ends can be used as the display element 172. For example, a liquid crystal element or an element used for electronic paper or the like, such as an electrophoretic element or a twisting ball element, can be used.

The wiring GL has a function of supplying signals for controlling the on/off state of the transistor M0, and the wiring SL has a function of supplying a voltage applied to the display element 172 through the transistor M0.

Since the off-state current of the transistor M0 is extremely low, when the transistor M0 is turned off, the node N7 can hold a voltage applied immediately before turning off the transistor M0. While the voltage of the node N7 is held, the display element 172 can maintain its display state.

The pixel 170 can hold the voltage of the node N7 for a long time. Thus, the optical characteristics of the display element 172 can be unchanged even when supply of a power supply voltage is stopped. For example, even in the case where a liquid crystal element that cannot store data, such as a twisted nematic (TN) liquid crystal, is used, the element can be always maintained in a state in which a voltage is applied. Consequently, it is possible to exclude rewrite operation or it is possible to reduce the frequency of rewrite operation markedly.

FIG. 12B illustrates the circuit structure of a display device 180 including the pixels 170 arranged in a matrix and the circuit 100 described in Embodiment 1.

The display device 180 includes the pixels 170 arranged in a matrix of m rows and n columns. The pixels 170 provided in the m-th row are electrically connected to a wiring GL[m], and the pixels 170 provided in the n-th column are electrically connected to a wiring SL[n].

The second gates of the transistors M0 included in the pixels 170 are electrically connected to the circuit 100 through the wirings BGL. In other words, the circuit 100 has a function of supplying signals for controlling the second gates of the transistors M0 included in all the pixels.

When the circuit 100 controls the second gate of the transistor M0, the transistor M0 can have appropriate $V_{th}$ and can be prevented from being normally-on. Consequently, the off-state current of the transistor M0 can be reduced, and the transistor M0 can hold charge given to the node N7.

The circuit 100 can control and hold the threshold voltages of the transistors M0 in the pixels 170 connected to the circuit 100 at optimal levels and can temporarily change the threshold voltages so that the transistors M0 are set as normally-on transistors. When m×n transistors connected to the circuit 100 are temporarily changed into normally-on transistors, the voltage (i.e., display images) stored in the pixels can be refreshed at the same time by one signal.

When the display device 180 has such a structure, it is possible to provide a display device capable of operating at low power with infrequent rewrite operation. In addition, it is possible to obtain a display device including a plurality of pixels that can easily perform refresh operation. Furthermore, it is possible to obtain a display device capable of displaying an image even when supply of power is stopped.

The structures, the methods, and the like described in this embodiment can be combined with any of the structures, the methods, and the like described in the other embodiments as appropriate.

Embodiment 3

In this embodiment, examples of transistors that can be used as the transistors M0 and M1 described in Embodiments 1 and 2 are described.

<Structure of Transistor>

Figure 13A:
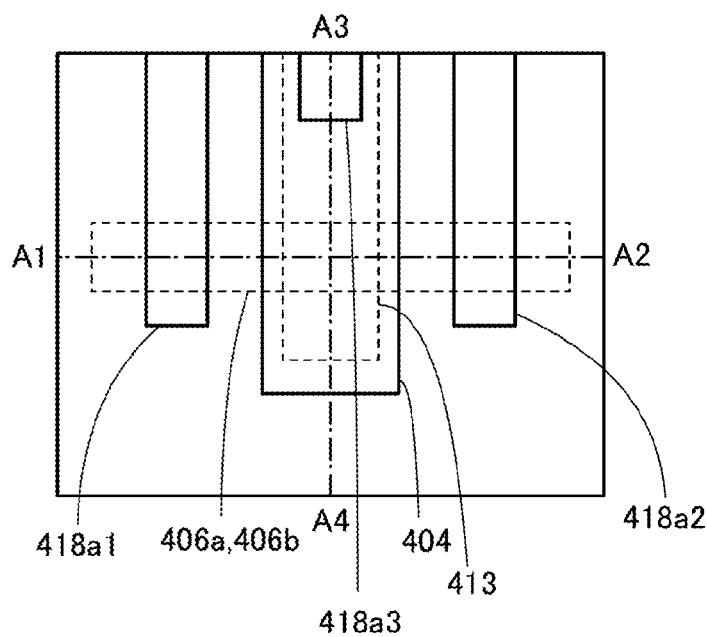
FIGS. 13A to 13C are a top view and cross-sectional views illustrating part of a transistor of one embodiment of the present invention.
Figure 13B:
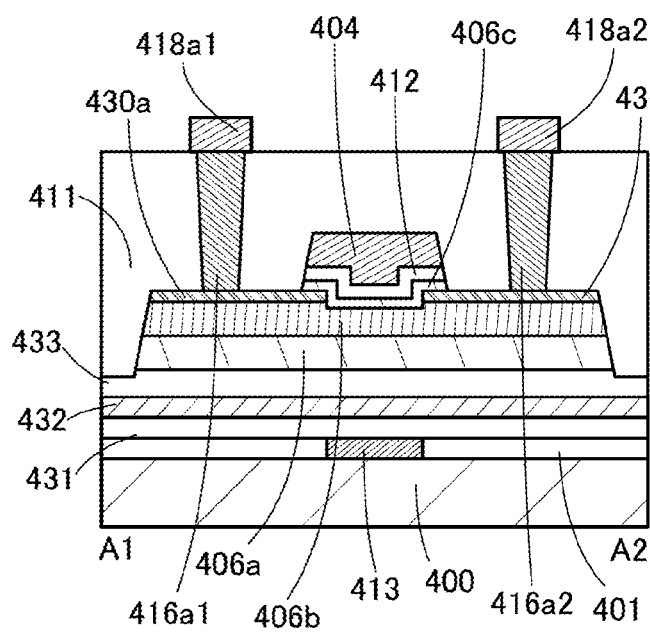
Figure 13C:
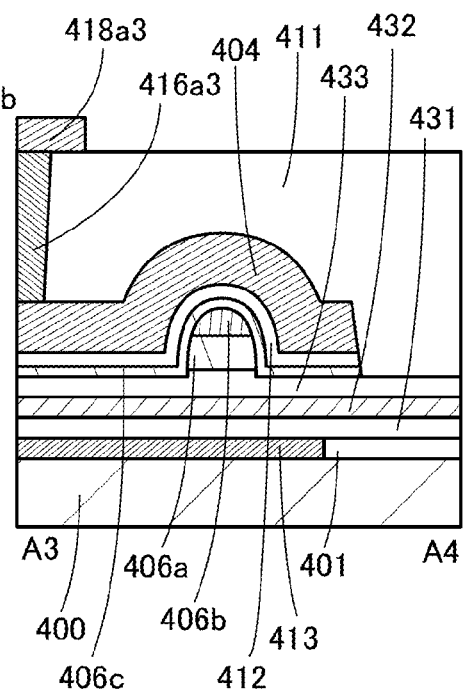

FIGS. 13A to 13C are a top view and cross-sectional views of the semiconductor device of one embodiment of the present invention. FIG. 13A is a top view. FIG. 13B is a cross-sectional view taken along dashed-dotted line A1-A2 in FIG. 13A, which illustrates a cross-sectional shape in the channel length direction. FIG. 13C is the cross-sectional view taken along a dashed-dotted line A3-A4 in FIG. 13A and illustrates a cross-sectional shape in a channel width direction. Note that for simplification of the drawing, some components in the top view in FIG. 13A are not illustrated.

A transistor illustrated in FIGS. 13A to 13C includes a conductor 413 over a substrate 400; an insulator 401 over the substrate 400; an insulator 431 over the conductor 413; an insulator 432 over the insulator 431; an insulator 433 over the insulator 432; an insulator 406a over the insulator 433; a semiconductor 406b over the insulator 406a; conductors 430a and 430b over the semiconductor 406b; an insulator 406c over the semiconductor 406b; an insulator 412 over the insulator 406c; a conductor 404 positioned over the semiconductor 406b with the insulator 412 and the insulator 406c interposed therebetween; an insulator 411 over the conductors 404, 430a, and 430b; openings reaching the conductors 404, 430a and 430b, respectively through the insulator 411; conductors 416a3, 416a1, and 416a2 embedded in the openings and having regions in contact with the conductors 404, 430a, and 430b, respectively; a conductor 418a1 over the conductor 416a1; a conductor 418a2 over the conductor 416a2; and a conductor 418a3 over the conductor 416a3.

The insulator 431 and the insulator 433 are each preferably formed using an insulator containing silicon. For example, silicon oxide or silicon oxynitride is preferably contained. The insulator 431 and the insulator 433 are formed by a sputtering method, a chemical vapor deposition (CVD) method, or the like.

The insulator 432 is preferably formed using an insulator containing at least one of aluminum, hafnium, gallium, yttrium, and zirconium. For example, aluminum oxide, aluminum oxynitride, hafnium oxide, hafnium oxynitride, hafnium silicate, gallium oxide, gallium oxynitride, yttrium oxide, yttrium oxynitride, zirconium oxide, or zirconium oxynitride may be used. Alternatively, magnesium oxide, germanium oxide, lanthanum oxide, neodymium oxide, tantalum oxide, or the like may be used. The insulator 432 is formed by a sputtering method, a metal organic CVD (MOCVD) method, an atomic layer deposition (ALD) method, or the like. Furthermore, the insulator 432 preferably has a function of holding charges. For example, when the insulators 431 and 433 have a function of inhibiting release of electrons and electrons are held by the insulator 432, the electrons might behave as if they are negative fixed charges. Thus, the threshold voltage of the transistor can be shifted in the positive direction, which is preferable.

The insulator 406a and the insulator 406c preferably include at least one element other than oxygen included in the semiconductor 406b. This can suppress generation of defects at an interface between the semiconductor 406b and the insulator 406a and an interface between the semiconductor 406b and the insulator 406c.

The semiconductor 406b preferably includes an oxide semiconductor, specifically a CAAC-OS which is described later.

In this transistor, the conductor 404 functions as a first gate electrode. The conductor 404 can have a stacked structure including a conductor that does not easily transmit oxygen. For example, when the conductor that does not easily transmit oxygen is formed as a lower layer, a decrease in conductivity caused by oxidation of the conductor 404 can be prevented. The insulator 412 functions as a first gate insulator. Note that the conductivity of the conductor can be measured by a two-terminal method or the like.

The conductor 413 functions as a second gate electrode. The conductor 413 can have a stacked structure including a conductive film that does not easily transmit oxygen. When the conductor 413 has a stacked structure including a conductive film that does not easily transmit oxygen, a decrease in conductivity caused by oxidation of the conductor 413 can be prevented. The insulators 431, 432, and 433 function as second gate insulators. The threshold voltage of the transistor can be controlled by a potential applied to the conductor 413. Note that the function of the first gate electrode may be interchanged with the function of the second gate electrode.

As illustrated in FIG. 13C, the semiconductor 406b can be electrically surrounded by an electric field of the conductor 404 functioning as the first gate electrode. A structure in which a semiconductor is electrically surrounded by an electric field of a gate electrode is referred to as a surrounded channel (s-channel) structure. Thus, in some cases, a channel is formed in the entire semiconductor 406b. In the s-channel structure, a large amount of current can flow between a source and a drain of the transistor, so that an on-state current can be increased. In addition, since the semiconductor 406b is surrounded by the electric field of the conductor 404, an off-state current can be decreased.

The insulator 406a, the semiconductor 406b, and the insulator 406c may each have a stacked structure including two or more layers.

The conductors 430a and 430b may be provided so as to be in contact with not only the semiconductor 406b but also the insulators 406a and 433.

Figure 14A:
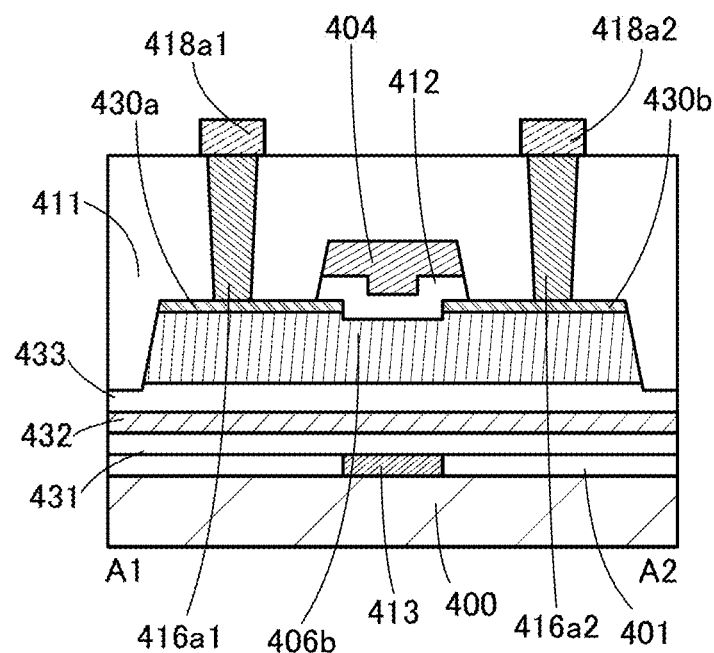
FIGS. 14A and 14B are cross-sectional views each illustrating part of a transistor of one embodiment of the present invention.

The insulators 406a and 406c may be omitted (see FIG. 14A).

Figure 14B:
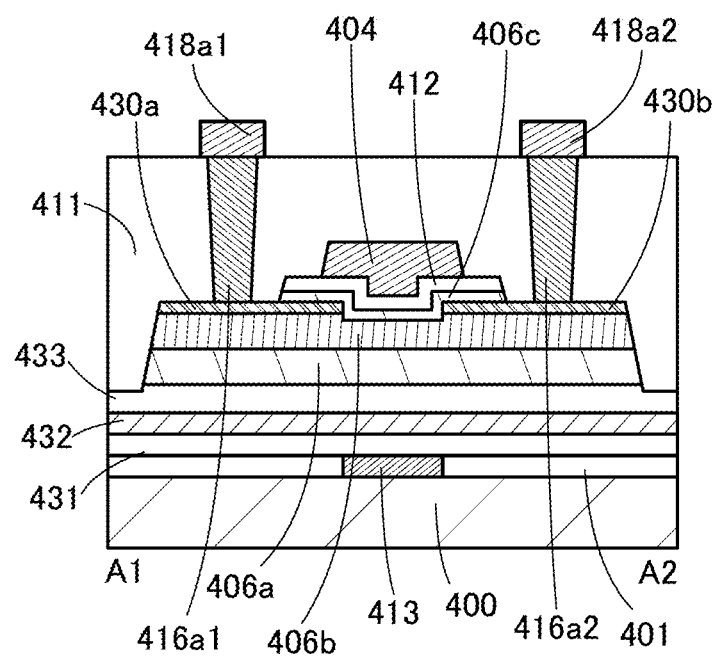
Figure 15A:
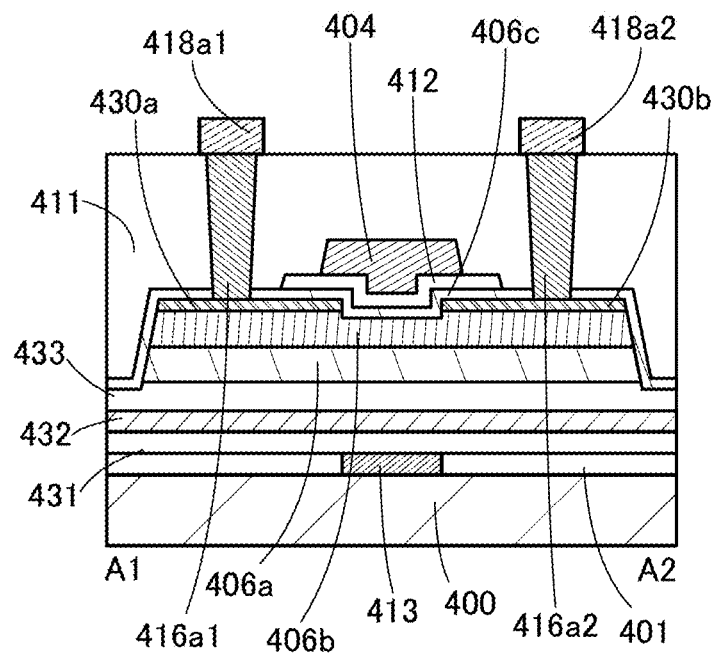
FIGS. 15A and 15B are cross-sectional views each illustrating part of a transistor of one embodiment of the present invention.
Figure 15B:
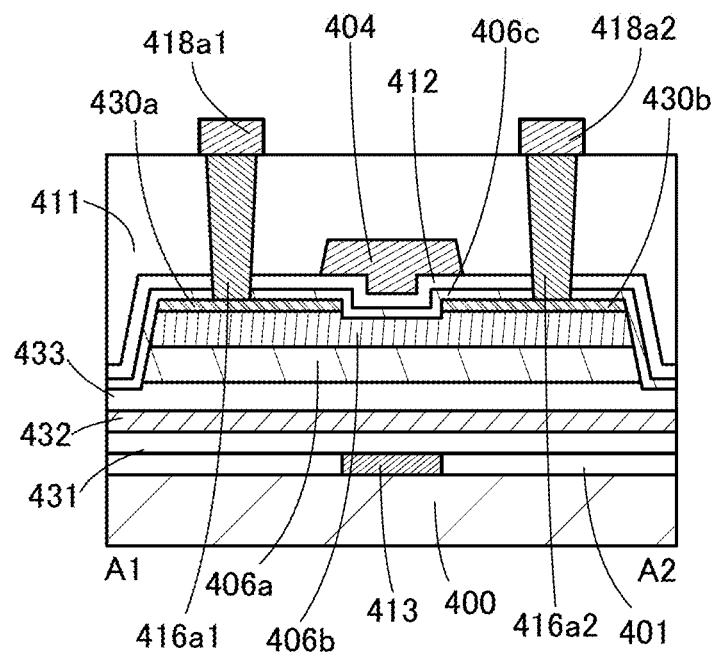

Alternatively, as illustrated in FIG. 14B, a structure may be employed in which insulators 412 and 406c protrude from the conductor 404. Alternatively, as illustrated in FIG. 15A, a structure may be employed in which the insulator 406c covers the conductors 430a and 430b, the semiconductor 406b, and the insulator 406a and the insulator 412 protrudes from the conductor 404. Further alternatively, as illustrated in FIG. 15B, a structure may be employed in which the insulator 406c covers the conductors 430a and 430b, the semiconductor 406b, and the insulator 406a and the insulator 412 is positioned over the insulator 406c.

Figure 16A:
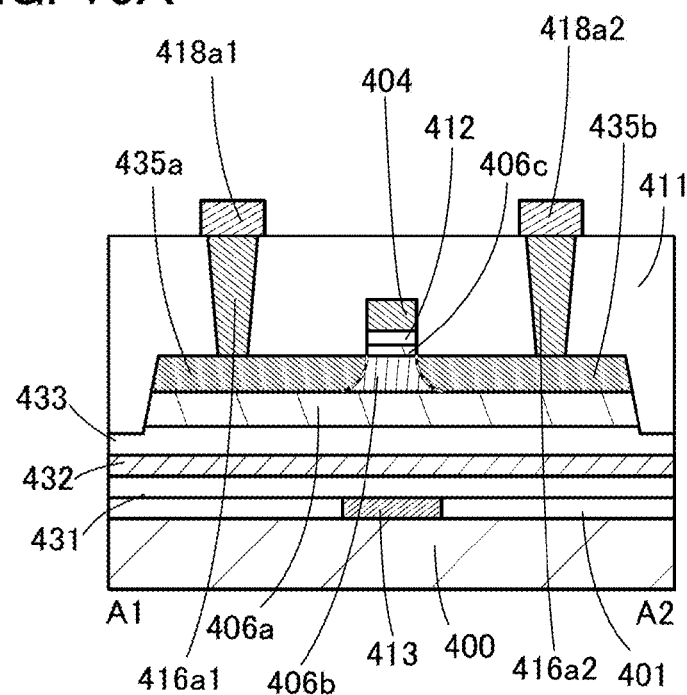
FIGS. 16A and 16B are cross-sectional views each illustrating part of a transistor of one embodiment of the present invention.

Further alternatively, like a transistor illustrated in FIG. 16A, low-resistance regions 435a and 435b may be formed in the semiconductor 406b. It is preferable that the low-resistance regions 435a and 435b be formed in regions which do not overlap with the conductor 404 and the insulators 412 and 406c in the semiconductor 406b. Alternatively, part of a region of the semiconductor 406b which overlaps with the conductor 404 and the insulators 412 and 406c may be a low-resistance region. The low-resistance regions 435a and 435b can function as a source region and a drain region of the transistor. The low-resistance regions 435a and 435b in the semiconductor 406b can reduce contact resistance between the semiconductor 406b and each of the conductors 416a1 and 416a2.

The low-resistance regions 435a and 435b can be formed by addition of an impurity, for example. For example, one or more of the following can be used as an impurity to be added: phosphorus, boron, nitrogen, argon, and xenon. Furthermore, the addition of an impurity is performed by plasma treatment, ion implantation, ion doping, or the like. It is preferable that the low-resistance regions 435a and 435b include more oxygen vacancies than a region other than the low-resistance regions 435a and 435b. Thus, carrier density is increased by formation of a donor level, resulting in a reduction in the resistance value.

The low-resistance regions 435a and 435b may each have lower crystallinity than the region other than the low-resistance regions 435a and 435b.

The conductors 416a1 and 416a2 are electrically connected to the semiconductor 406b and function as a source wiring and a drain wiring. Specifically, it is preferable that the conductors 416a1 and 416a2 be electrically connected to the low-resistance regions 435a and 435b that are a source region and a drain region in the semiconductor 406b. In addition, the conductors 416a1 and 416a2 can each have a stacked-layer structure including a conductor that is less likely to transmit oxygen. For example, forming a conductor that is less likely to transmit oxygen in an upper layer can prevent decrease in conductivity due to oxidation of the conductor 416a1 and the conductor 416a2.

Figure 16B:
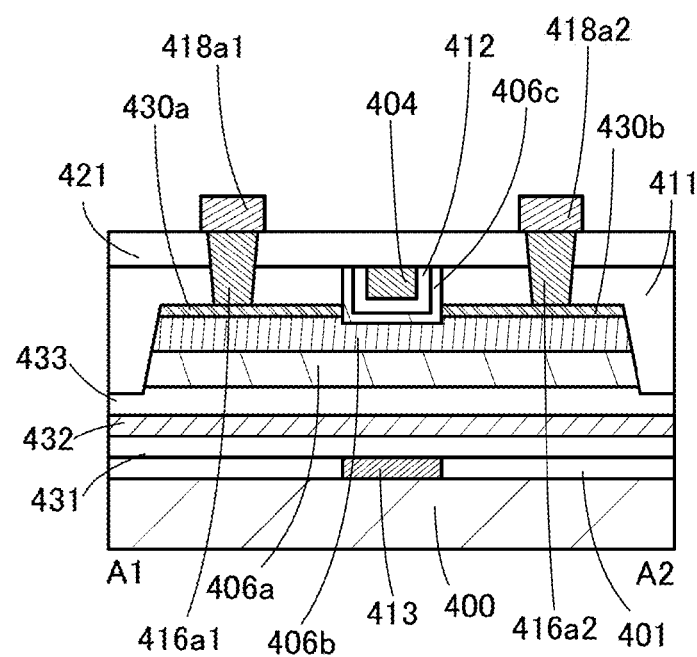

Alternatively, a transistor may have a structure as illustrated in FIG. 16B. In the transistor illustrated in FIG. 16B, top surfaces of the insulator 411, the insulator 406c, the insulator 412, and the conductor 404 are substantially aligned and flat. In order to form the transistor to have such a shape, the top surfaces of the insulator 411, the insulator 406c, the insulator 412, and the conductor 404 are planarized by chemical mechanical polishing (CMP) or the like. After that, an insulator 421 is formed; then, the conductors 416a1 and 416a2 and the conductors 418a1 and 418a2 are formed. Note that the insulator 421 is formed in a manner similar to that of the insulator 411.

With such a structure, there is hardly any region where the conductor 404 and the conductor 430a or the conductor 430b overlap with each other; as a result, parasitic capacitance in the transistor between a gate and a source and between the gate and a drain can be reduced. The reduction in the parasitic capacitance enables the switching speed of the transistor to be improved; thus, a transistor with high frequency characteristics can be provided.

<Semiconductor>

A detailed structure of the semiconductor 406b will be described below.

A detailed structure of each of the insulator 406a and the insulator 406c will be described in addition to that of the semiconductor 406b.

As the semiconductor 406b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The insulator 406a and the insulator 406c are desirably oxides including one or more, or two or more elements other than oxygen included in the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

The semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, magnesium, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide, a or gallium tin oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band. Note that either of the insulator 406a and the insulator 406c may have a higher electron affinity than the other; alternatively, the insulator 406a and the insulator 406c may have the same electron affinity.

When a gate voltage is applied to such a transistor in which the insulator 406a is placed under the semiconductor 406b and the insulator 406c is placed over the semiconductor 406b, a channel is formed in the semiconductor 406b whose electron affinity is the highest among the insulator 406a, the semiconductor 406b, and the insulator 406c. Thus, a buried channel structure can be formed.

Figure 17:
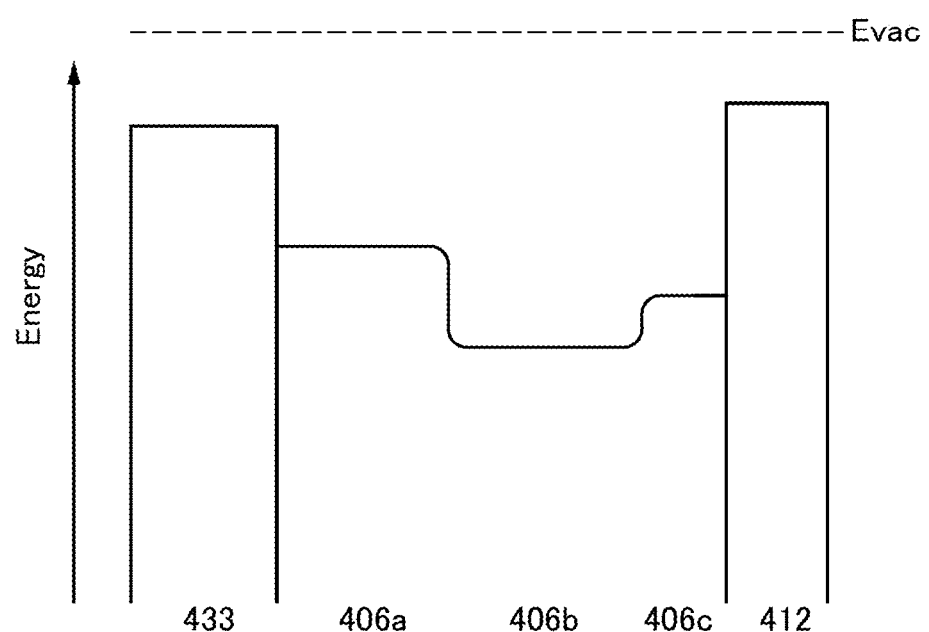
FIG. 17 is a band diagram of one embodiment of the present invention.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of defect states. For that reason, the stack of the insulator 406a, the semiconductor 406b, and the insulator 406c has a band structure where energy at each interface and in the vicinity of the interface is changed continuously (continuous junction) (see FIG. 17). Note that boundaries of the insulator 406a, the semiconductor 406b, and the insulator 406c are not clear in some cases.

At this time, electrons move mainly in the semiconductor 406b, not in the insulator 406a and the insulator 406c.

As factors of inhibiting electron movement are decreased, the on-state current of the transistor can be increased. Electron movement is inhibited, for example, in the case where physical unevenness in a channel formation region is large.

To increase the on-state current of the transistor, for example, root mean square (RMS) roughness with a measurement area of 1 µm×1 µm of the top surface or the bottom surface of the semiconductor 406b (a formation surface; here, the top surface of the insulator 406a) is less than 1 nm, preferably less than 0.6 nm, further preferably less than 0.5 nm, still further preferably less than 0.4 nm. The average surface roughness (also referred to as Ra) with the measurement area of 1 µm×1 µm is less than 1 nm, preferably less than 0.6 nm, further preferably less than 0.5 nm, still further preferably less than 0.4 nm. The maximum difference (P–V) with the measurement area of 1 µm×1 µm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Note that the three-layer structure including the insulator 406a, the semiconductor 406b, and the insulator 406c is an example. For example, a two-layer structure not including the insulator 406a or the insulator 406c may be employed. Alternatively, a single-layer structure not including the insulator 406a and the insulator 406c may be employed. Further alternatively, it is possible to employ an n-layer structure (n is an integer of four or more) that includes any of the insulator, semiconductor, and conductor given as examples of the insulator 406a, the semiconductor 406b, and the insulator 406c.

<Structure of Oxide Semiconductor>

The structure of an oxide semiconductor is described below.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 18A:
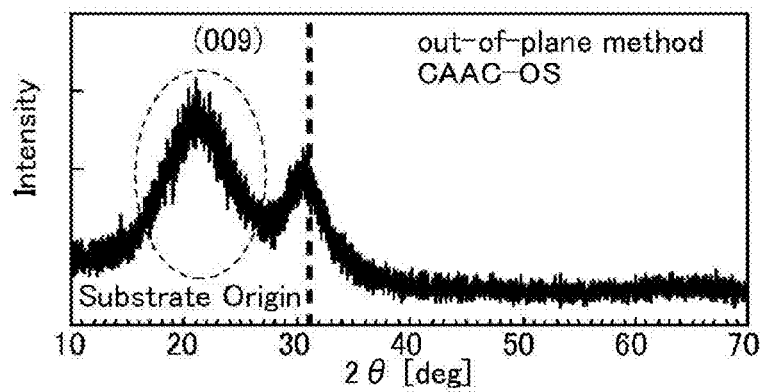
FIGS. 18A to 18E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R–3m is analyzed by an out-of-plane method, a peak appears at a diffraction angle (2θ) of around 31° as illustrated in FIG. 18A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd–3m. Therefore, it is preferable that the CAAC-OS do not show the peak.

Figure 18B:
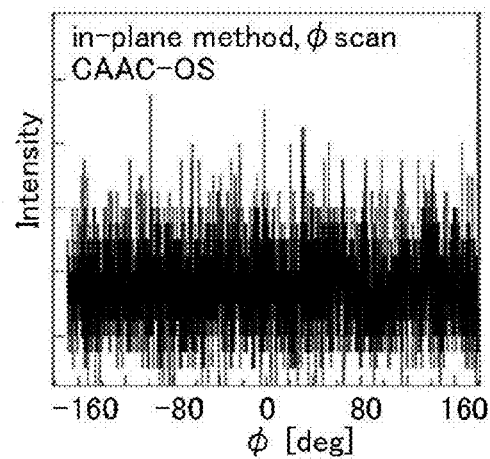
Figure 18C:
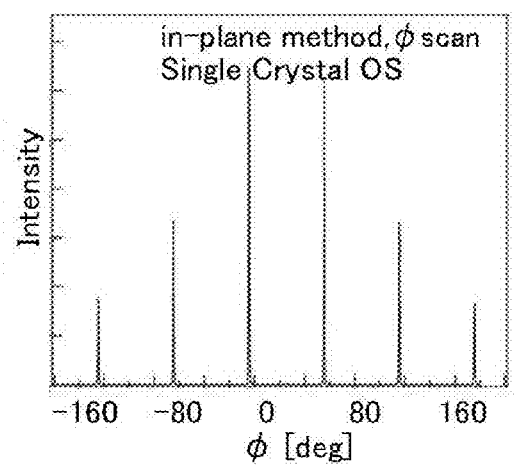

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as illustrated in FIG. 18B, a peak is not clearly observed. In contrast, in the case where single crystal InGaZnO$_4$ is subjected to φ scan with 2θ fixed at around 56°, as illustrated in FIG. 18C, six peaks which are derived from crystal planes equivalent to the (110) plane are observed. Accordingly, the structural analysis using XRD shows that the directions of a-axes and b-axes are irregularly orientated in the CAAC-OS.

Figure 18D:
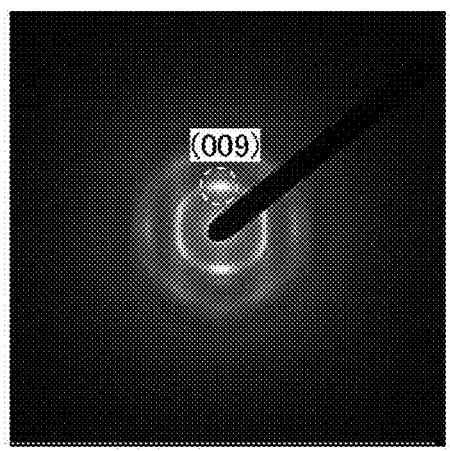
Figure 18E:
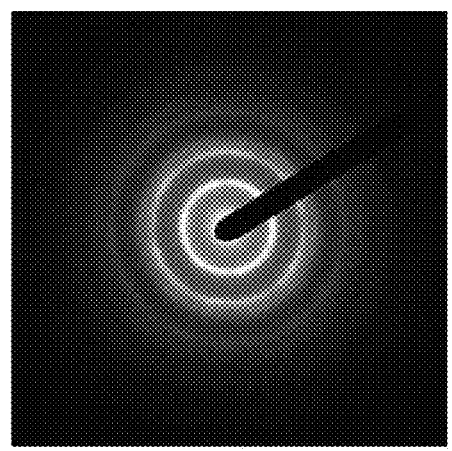

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) illustrated in FIG. 18D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 18E shows a diffraction pattern obtained in such a manner that an electron beam with a probe diameter of 300 nm is incident on the same sample in a direction perpendicular to the sample surface. As illustrated in FIG. 18E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 18E is considered to be derived from the (010) plane, the (100) plane, and the like of the InGaZnO$_4$ crystal. The second ring in FIG. 18E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 19A:
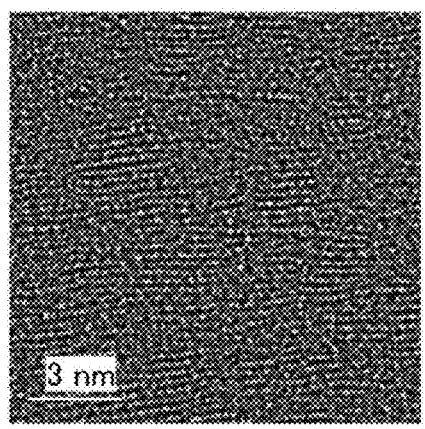
FIGS. 19A to 19E show a cross-sectional TEM image and plan-view TEM images of a CAAC-OS and images obtained through analysis thereof.

FIG. 19A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 19A shows pellets in which metal atoms are arranged in a layered manner. FIG. 19A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 19B:
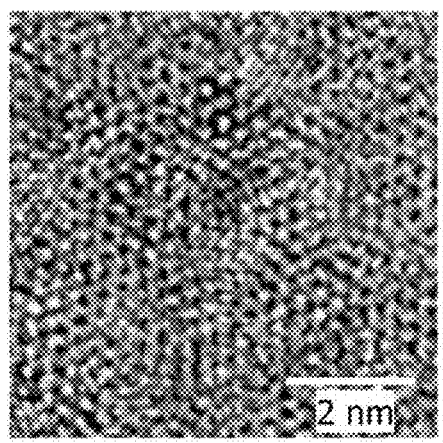
Figure 19C:
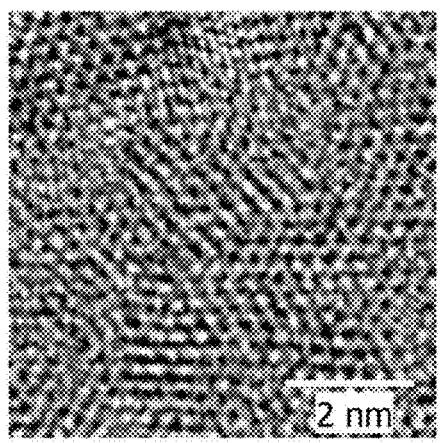
Figure 19D:
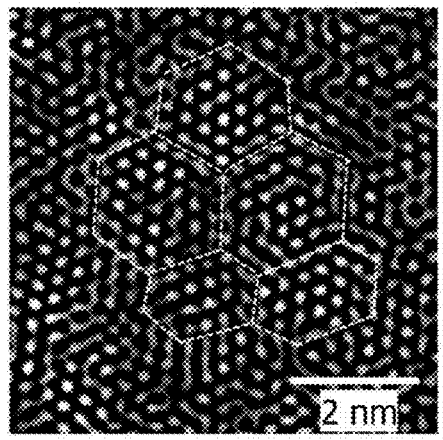
Figure 19E:
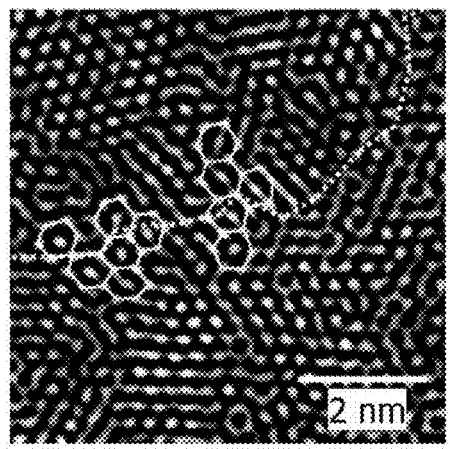

FIGS. 19B and 19C show Cs-corrected high-resolution TEM images of a plane of the CAAC-OS observed from a direction substantially perpendicular to the sample surface. FIGS. 19D and 19E are images obtained through image processing of FIGS. 19B and 19C. The method of image processing is as follows. The image in FIG. 19B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 19D, a portion where a lattice arrangement is broken is shown by a dashed lines. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 19E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 20A:
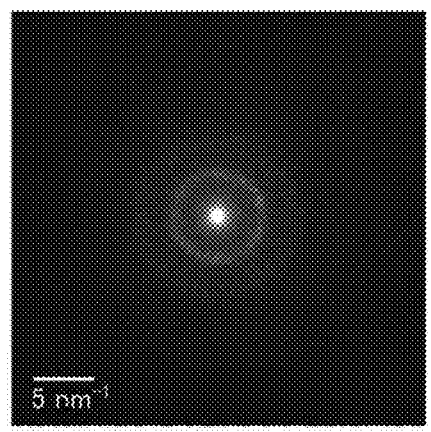
FIGS. 20A to 20D show electron diffraction patterns and a cross-sectional TEM image of an nc-OS.
Figure 20B:
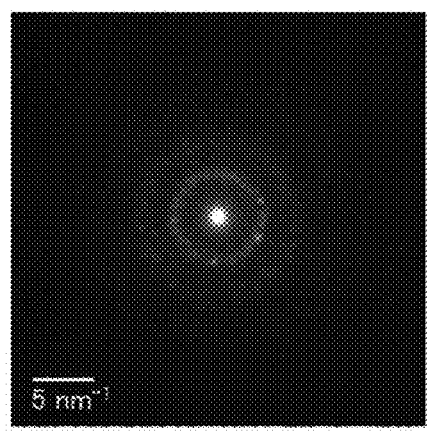

For example, when an electron beam with a probe diameter of 50 nm is incident on a 34-nm-thick region of a thinned nc-OS including an $InGaZnO_4$ crystal in a direction parallel to the formation surface, a ring-shaped diffraction pattern (nanobeam electron diffraction pattern) illustrated in FIG. 20A is observed. FIG. 20B shows a diffraction pattern obtained when an electron beam with a probe diameter of 1 nm is incident on the same sample. As illustrated in FIG. 20B, a plurality of spots are observed in a ring-like region. In other words, ordering in an nc-OS is not observed with an electron beam with a probe diameter of 50 nm but is observed with an electron beam with a probe diameter of 1 nm.

Figure 20C:
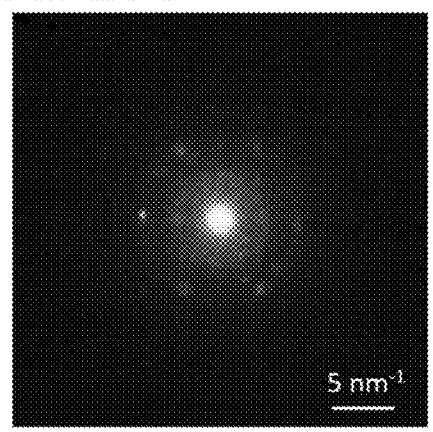

Furthermore, an electron diffraction pattern in which spots are arranged in an approximately hexagonal shape is observed in some cases as illustrated in FIG. 20C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 20D:
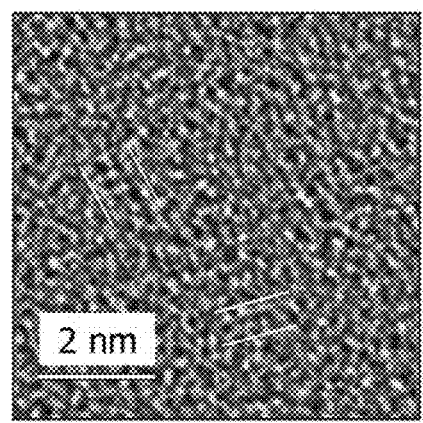

FIG. 20D shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines in FIG. 20D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<A-Like OS>

An a-like OS is an oxide semiconductor having a structure between the nc-OS and the amorphous oxide semiconductor.

FIGS. 21A and 21B are high-resolution cross-sectional TEM images of an a-like OS. FIG. 21A is the high-resolution cross-sectional TEM image of the a-like OS at the start of electron irradiation. FIG. 21B is the high-resolution cross-sectional TEM image of a-like OS after electron ($e^-$) irradiation at $4.3 \times 10^8$ $e^-/nm^2$. FIGS. 21A and 21B show that stripe-like bright regions extending vertically are observed in the a-like OS from the start of electron irradiation. It can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 22:
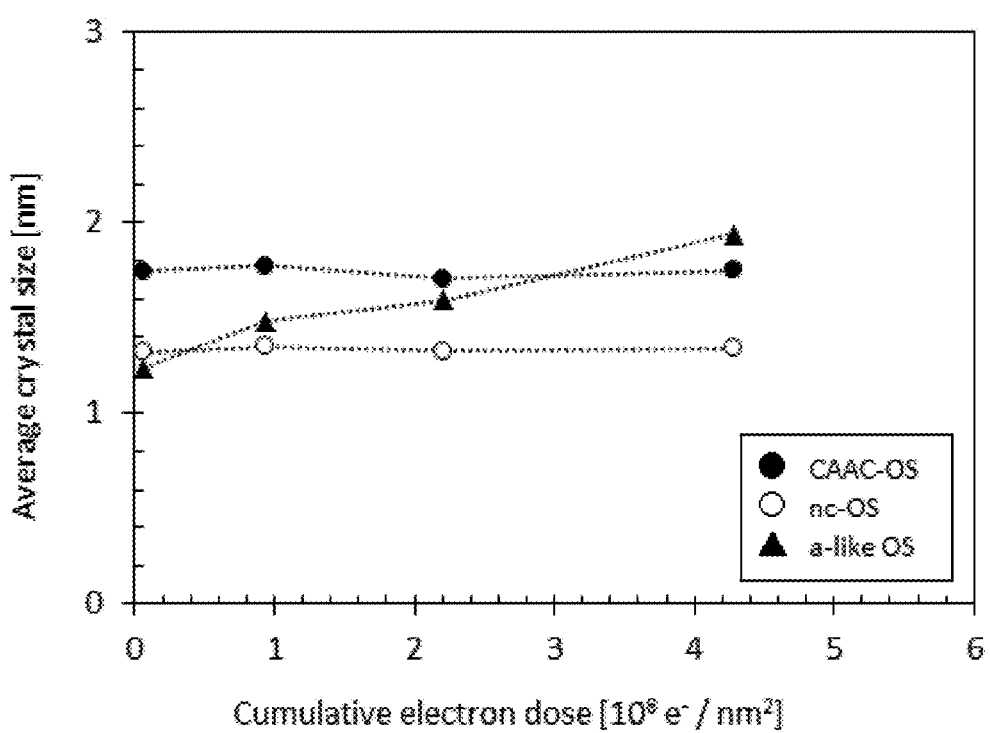
FIG. 22 shows a change of crystal parts of an In—Ga—Zn oxide owing to electron irradiation.

FIG. 22 shows a change in the average size of crystal parts (at 22 to 30 points) in each sample. Note that the crystal part size corresponds to the length of the lattice fringe. FIG. 22 indicates that the crystal part size in the a-like OS increases with an increase in the cumulative electron dose in obtaining TEM images, for example. As illustrated in FIG. 22, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show little change from the start of electron irradiation to a cumulative electron dose of $4.2 \times 10^8$ $e^-/nm^2$. As illustrated in FIG. 22, the crystal part sizes in the nc-OS and the CAAC-OS are approximately 1.3 nm and approximately 1.8 nm, respectively, regardless of the cumulative electron dose. For electron beam irradiation and TEM observation, a Hitachi H-9000NAR transmission electron microscope was used. The conditions of electron beam irradiation were as follows: an accelerating voltage was 300 kV; current density was $6.7 \times 10^5$ $e^-/(nm^2 \cdot s)$; and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor with an atomic ratio of In:Ga:Zn=1:1:1, the density of an a-like OS is higher than or equal to 5.0 $g/cm^3$ and lower than 5.9 $g/cm^3$. In addition, for example, in the case of the oxide semiconductor with an atomic ratio of In:Ga:Zn=1:1:1, the density of an nc-OS or a CAAC-OS is higher than or equal to 5.9 $g/cm^3$ and lower than 6.3 $g/cm^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example.

<Substrate, Insulator, Conductor>

Components other than the semiconductor of the transistor are described in detail below.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, or gallium oxide is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The transistor is surrounded by an insulator having a function of blocking oxygen and impurities such as hydrogen, so that the electronic characteristics of the transistor can be stable. For example, the insulator 401, the insulator 432, the insulator 412, the insulator 411, or the insulator 421 may include a single layer or stacked layers of an insulator which has a function of blocking oxygen and impurities such as hydrogen.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Alternatively, as the insulator which has a function of blocking oxygen and impurities such as hydrogen, aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide may be used. for example, The insulators 401, 431, and 433 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 401, 431, and 433 each preferably contain silicon oxide or silicon oxynitride.

The insulator 421 is formed in a manner similar to that of the insulator 401.

The insulator 411 preferably contains silicon nitride, silicon nitride oxide, aluminum nitride, aluminum oxynitride, or the like. Alternatively, the insulator 411 may be formed with a stack including the insulator that can be used as the insulator 401 and the like.

The insulator 432 is preferably formed using an insulator containing at least one of aluminum, hafnium, gallium, yttrium, and zirconium. For example, aluminum oxide, aluminum oxynitride, hafnium oxide, hafnium oxynitride, hafnium silicate, gallium oxide, gallium oxynitride, yttrium oxide, yttrium oxynitride, zirconium oxide, or zirconium oxynitride may be used. Alternatively, magnesium oxide, germanium oxide, lanthanum oxide, neodymium oxide, or tantalum oxide may be used. The insulator 432 is formed by a sputtering method, a metal organic CVD (MOCVD) method, an atomic layer deposition (ALD) method, or the like.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 preferably contain silicon oxide or silicon oxynitride.

Note that the insulator 412 preferably contains an insulator with a high dielectric constant. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. The insulator 412 preferably has a stacked-layer structure including silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when an aluminum oxide, a gallium oxide, or a hafnium oxide of the insulator 412 is on the insulator 406c side, entry of silicon included in the silicon oxide or the silicon oxynitride into the semiconductor 406b can be suppressed. When silicon oxide or silicon oxynitride is on the insulator 406c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The conductors 430a and 430b and the conductors 416a1 and 416a2 may be each formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. Alternatively, a film of an alloy or compound containing the above element may be used: a conductor containing aluminum, a conductor containing copper and titanium, a conductor containing copper and manganese, a conductor containing indium, tin, and oxygen, a conductor containing titanium and nitrogen, or the like may be used. Furthermore, the conductor 416a3, the conductor 418a1, the conductor 418a2, and the conductor 418a3 may be formed in a similar manner.

The conductor 404 and the conductor 413 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Alternatively, a film of an alloy or compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

With the above structure of the transistor, a large amount of leakage current can be prevented from flowing through the conductor 404 functioning as a first gate electrode to the conductor 413 functioning as a second gate electrode. Thus, a transistor having favorable electrical characteristics can be provided. Furthermore, a transistor with stable electrical characteristics can be provided.

<Method for Manufacturing Transistor>

A method for manufacturing the transistor of the present invention illustrated in FIGS. 13A to 13C is described below with reference to FIGS. 23A to 23C, FIGS. 24A to 242C, FIGS. 25A to 25C, and FIGS. 26A to 26C.

First, the substrate 400 is prepared.

Next, the insulator 401 is formed over the substrate 400 and then is processed to form an opening. Next, the conductor is formed by a sputtering method, a CVD method, a molecular beam epitaxy (MBE) method, a pulsed laser deposition (PLD) method, or an ALD method. The conductor may have a multilayer structure including a conductor that is less likely to transmit oxygen. Polishing is performed by CMP or the like until part of the insulator 401 is exposed, whereby the conductor 413 is formed.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a TCVD method, and thus the yield of a semiconductor device can be increased. In addition, since the exposure to plasma during the deposition is not performed, a film with few defects can be obtained.

An ALD method also causes less plasma damage to an object.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Alternatively, the conductor 413 may be formed in such a manner that a conductor is formed over a substrate 400 and processed by a photolithography method or the like. Then an insulator to be the insulator 401 is deposited and polished by CMP or the like until part of the conductor 413 is exposed, to form the insulator 401.

In a lithography method, first, a resist is exposed to light through a photomask. Next, a region exposed to light is removed or left using a developing solution, so that a resist mask is formed. Then, etching through the resist mask is conducted. As a result, the conductor, the semiconductor, the insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing or wet etching treatment can be used for removal of the resist mask. Alternatively, wet etching treatment is performed after dry etching treatment. Still alternatively, dry etching treatment is performed after wet etching treatment.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, the insulator 431, the insulator 432 and the insulator 433 are formed. These insulators are formed as described above.

Next, high-density plasma treatment may be performed. The high-density plasma treatment is preferably performed in an oxygen atmosphere or a nitrogen atmosphere. The oxygen atmosphere is a gas atmosphere containing an oxygen atom and refers to atmospheres of oxygen, ozone, and nitrogen oxide (e.g., nitrogen monoxide, nitrogen dioxide, dinitrogen monoxide, dinitrogen trioxide, dinitrogen tetroxide, or dinitrogen pentoxide). In an oxygen atmosphere, an inert gas such as nitrogen or a rare gas (e.g., helium or argon) may be contained. With this high-density plasma treatment performed in an oxygen atmosphere, a Group 14 element such as carbon can be eliminated, for example. Furthermore, with the high-density plasma treatment in an oxygen atmosphere, an organic compound such as hydrocarbon is also easily eliminated from the treated object.

The high-density plasma treatment in a nitrogen atmosphere may be high-density plasma treatment in an atmosphere containing nitrogen and a rare gas, an atmosphere containing nitrogen, hydrogen, and a rare gas, or an atmosphere containing ammonia and a rare gas, for example. With this high-density plasma treatment in a nitrogen atmosphere, a surface of the treated object and its vicinity can be nitrided. The nitrided region can be formed to be extremely thin on the surface side of the treated object. This nitrided region can prevent diffusion of impurities.

After the high-density plasma treatment in an oxygen atmosphere is performed, the high-density plasma treatment in a nitrogen atmosphere may be performed. Alternatively, after the high-density plasma treatment in a nitrogen atmosphere is performed, the high-density plasma treatment in an oxygen atmosphere may be performed. Annealing treatment may be performed before or after each high-density plasma treatment. Note that it is in some cases preferable to let an enough amount of gas flow in order to increase the plasma density. When the gas amount is not enough, the deactivation rate of radicals becomes higher than the generation rate of radicals in some cases. For example, it is preferable in some cases to let a gas flow at 100 sccm or more, 300 sccm or more, or 800 sccm or more.

The high-density plasma treatment is performed using a microwave generated with a high-frequency generator that generates a wave having a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz (typically, 2.45 GHz). The treatment pressure can be higher than or equal to 10 Pa and lower than or equal to 5000 Pa, preferably higher than or equal to 200 Pa and lower than or equal to 1500 Pa, further preferably higher than or equal to 300 Pa and lower than or equal to 1000 Pa. The substrate temperature can be higher than or equal to 100° C. and lower than or equal to 600° C. (typically 400° C.). Furthermore, a mixed gas of oxygen and argon can be used.

For example, the high density plasma is generated using a 2.45 GHz microwave and preferably has an electron density of higher than or equal to $1\times10^{11}/cm^3$ and lower than or equal to $1\times10^{13}/cm^3$, an electron temperature of 2 eV or lower, and an ion energy of 5 eV or lower. Such high-density plasma treatment produces radicals with low kinetic energy and causes little plasma damage, compared with conventional plasma treatment. Thus, formation of a film with few defects is possible. The distance between an antenna that generates the microwave and the treated object is longer than or equal to 5 mm and shorter than or equal to 120 mm, preferably longer than or equal to 20 mm and shorter than or equal to 60 mm.

Alternatively, a plasma power source that applies a radio frequency (RF) bias to a substrate may be provided. The frequency of the RF bias may be 13.56 MHz, 27.12 MHz, or the like, for example. The use of high-density plasma enables high-density oxygen ions to be produced, and application of the RF bias to the substrate allows oxygen ions generated by the high-density plasma to be efficiently introduced into the treated object. Therefore, it is preferable to perform the high-density plasma treatment while a bias is applied to the substrate.

Following the high-density plasma treatment, annealing treatment may be successively performed without an exposure to the air. Following annealing treatment, the high-density plasma treatment may be successively performed without an exposure to the air. By performing high-density plasma treatment and annealing treatment in succession, entry of impurities during the treatment can be suppressed. Moreover, by performing annealing treatment after the high-density plasma treatment in an oxygen atmosphere, unnecessary oxygen that is added into the treated object but is not used to fill oxygen vacancies can be eliminated. The annealing treatment may be performed by lamp annealing or the like, for example.

The treatment time of the high-density plasma treatment is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

The treatment time of the annealing treatment at a temperature of higher than or equal to 250° C. and lower than or equal to 800° C., higher than or equal to 300° C. and lower than or equal to 700° C., or higher than or equal to 400° C. and lower than or equal to 600° C. is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

Next, an insulator to be the insulator 406a is formed over the insulator 433. The insulator can be formed by a sputtering method, a CVD method, an MBE method, a PLD method, an ALD method, or the like. It is particularly preferable to use a facing-target sputtering apparatus.

The use of the facing-target sputtering apparatus can reduce plasma damage induced during deposition of the insulator to be the insulator 406a. Thus, oxygen vacancies in a film can be reduced. In addition, the use of the facing-target sputtering apparatus allows deposition in high vacuum. In that case, impurity concentration (e.g., concentration of hydrogen, a rare gas (such as argon), or water) in the deposited insulator can be reduced.

Alternatively, a sputtering apparatus including an inductively-coupled antenna conductor plate may be used. Thus, a large film with high uniformity can be formed with a high deposition rate.

Deposition is preferably performed using a gas containing oxygen, a rare gas, a gas containing nitrogen, or the like. As the gas containing nitrogen, nitrogen (N₂), dinitrogen oxide (N₂O), ammonia (NH₃), or the like may be used, for example.

Next, a semiconductor to be the semiconductor 406b is formed. The semiconductor to be the semiconductor 406b can be formed by a sputtering method, a CVD method, an MBE method, a PLD method, an ALD method, or the like. It is particularly preferable to use a facing-target sputtering apparatus.

The use of the facing-target sputtering apparatus can reduce plasma damage during deposition of the semiconductor. Thus, oxygen vacancies in the film can be reduced. In addition, when using the facing-target sputtering apparatus, deposition in high vacuum is possible, which enables the impurity concentration (e.g., concentration of hydrogen, a rare gas (such as argon), or water) in the deposited semiconductor to be reduced.

Alternatively, a sputtering apparatus including an inductively coupled antenna conducting plate may be used. In that case, a film with a large area and high uniformity can be deposited with a high deposition rate.

The deposition is preferably performed using a gas containing oxygen, a rare gas, a gas containing nitrogen, or the like. As the gas containing nitrogen, nitrogen (N₂), dinitrogen monoxide (N₂O), ammonia (NH₃), or the like may be used, for example.

Next, first heat treatment is preferably performed. The first heat treatment can be performed at a temperature higher than or equal to 250° C. and lower than or equal to 650° C., preferably higher than or equal to 450° C. and lower than or equal to 600° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate eliminated oxygen. By the first heat treatment, crystallinity of the semiconductor can be increased and impurities such as hydrogen and water can be removed. Before or after the first heat treatment, the above-described high-density plasma treatment may be performed.

Next, a conductor to be the conductor 430 is formed. The conductor to be the conductor 430 can be formed by a sputtering method, a CVD method, an MBE method, a PLD method, an ALD method, or the like.

Figure 23A:
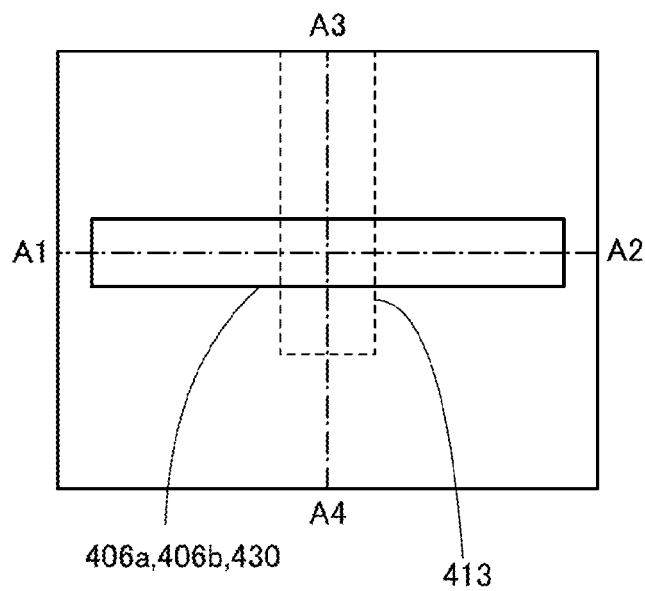
FIGS. 23A to 23C are a top view and cross-sectional views illustrating a method for manufacturing a transistor of one embodiment of the present invention.
Figure 23B:
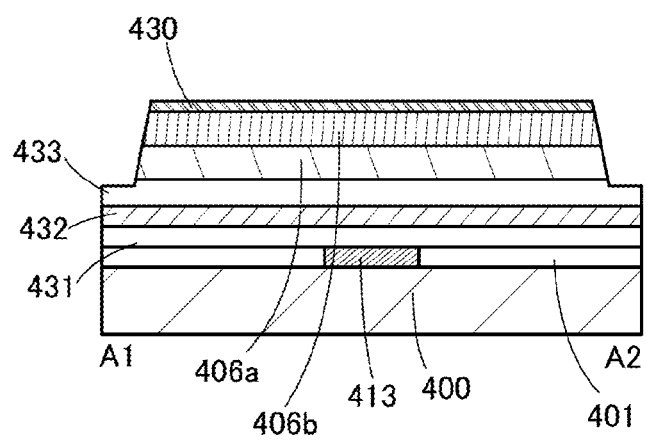
Figure 23C:
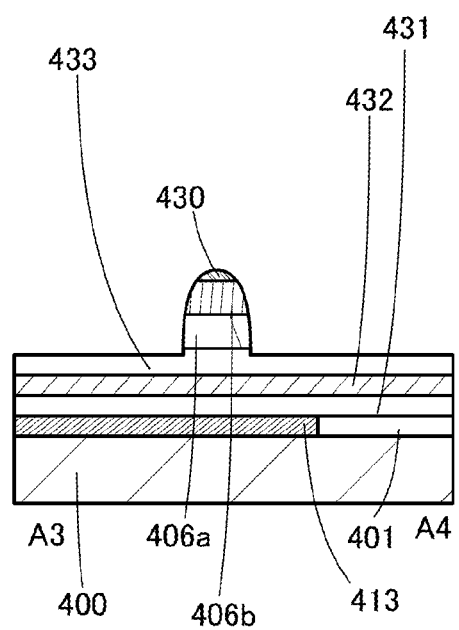

Then, the insulator to be the insulator 406a, the semiconductor to be the semiconductor 406b, and the conductor to be the conductor 430 are processed by a lithography method or the like to form a multilayer film including the insulator 406a, the semiconductor 406b, and the conductor 430 (see FIGS. 23A to 23C). Note that when the multilayer film is formed, the insulator 433 might also be etched and a thinned region might partly be formed. That is, the insulator 433 might have a shape including a projection in a region in contact with the multilayer film. Furthermore, when processing by a photolithography method is performed, an insulator, a conductor, or the like may be used for a mask. After the formation of the multilayer film, heat treatment may be performed in a manner similar to that of the first heat treatment.

Figure 24A:
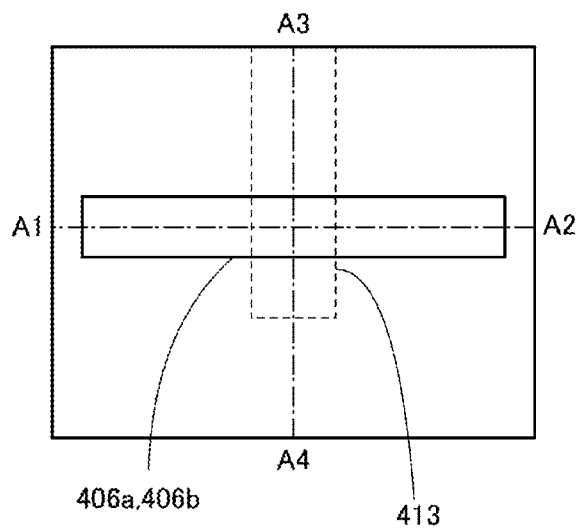
FIGS. 24A to 24C are a top view and cross-sectional views illustrating a method for manufacturing a transistor of one embodiment of the present invention.
Figure 24B:
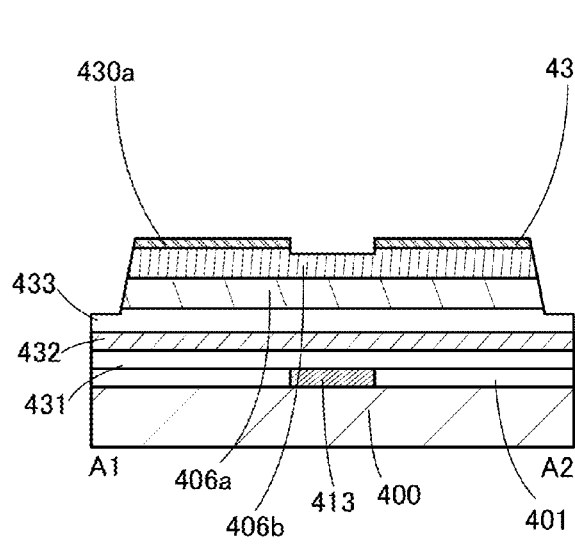
Figure 24C:
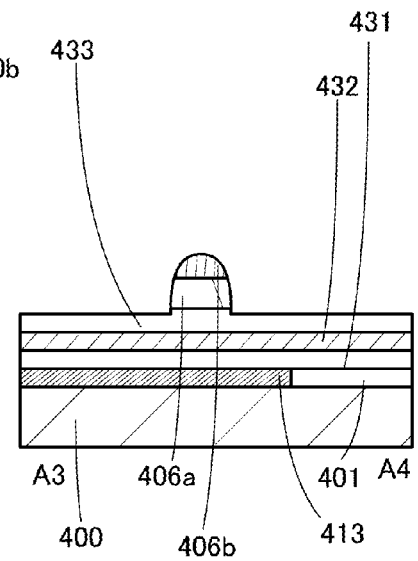

Next, the conductor 430 is processed by a photolithography method or the like to form the conductors 430a and 430b (see FIG. 24B).

Next, an insulator to be the insulator 406c is formed. The insulator to be the insulator 406c can be formed by a sputtering method, a CVD method, an MBE method, a PLD method, an ALD method, or the like. The insulator to be the insulator 406c may be deposited in a manner similar to that of the insulator 406a. After the insulator to be the insulator 406c is deposited, the above-described high-density plasma treatment may be performed.

Next, an insulator to be the insulator 412 is formed over the insulator to be the insulator 406c. The insulator to be the insulator 412 can be formed by a sputtering method, a CVD method, an MBE method, a PLD method, an ALD method, or the like.

The insulator to be the insulator 412 is preferably formed by an ALD method by which favorable coverage is formed. Specifically, the insulator to be the insulator 412 is preferably formed while the substrate is heated. The substrate temperature may be higher than or equal to 100° C. and lower than or equal to 600° C., preferably higher than or equal to 300° C. and lower than or equal to 500° C.

Next, a conductor to be the conductor 404 is formed. The conductor to be the conductor 404 can be formed by a sputtering method, a CVD method, an MBE method, a PLD method, an ALD method, or the like.

Figure 25A:
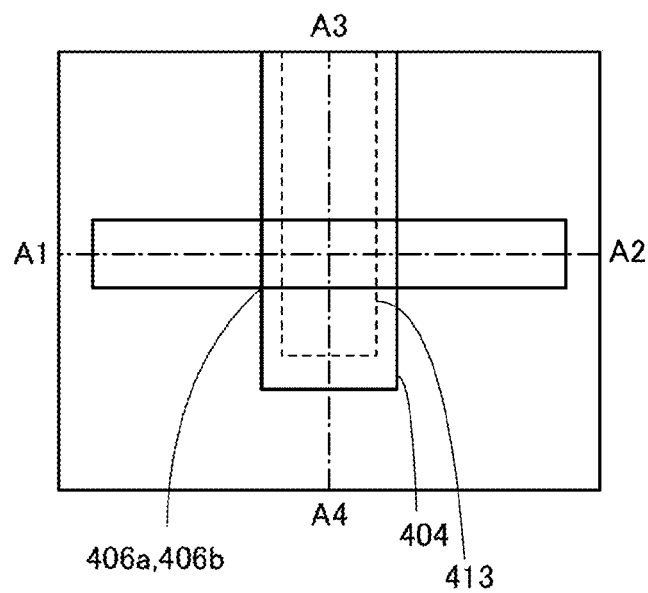
FIGS. 25A to 25C are a top view and cross-sectional views illustrating a method for manufacturing a transistor of one embodiment of the present invention.
Figure 25B:
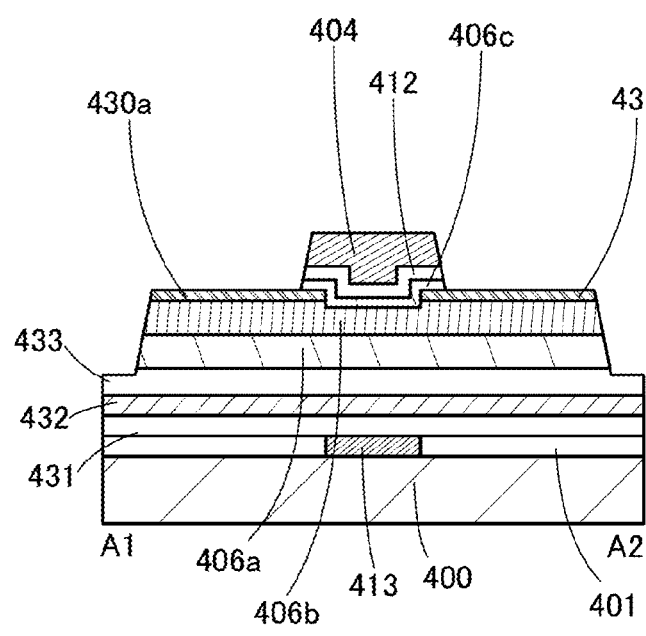
Figure 25C:
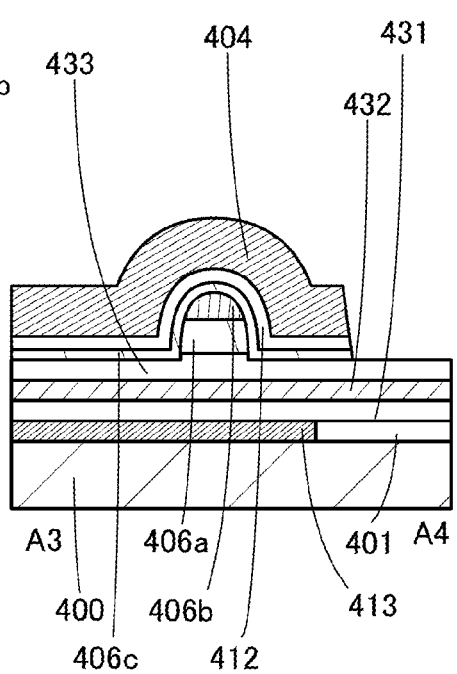

The insulator to be the insulator 406c, the insulator to be the insulator 412, and the conductor to be the conductor 404 are processed by a photolithography method, whereby the insulator 406c, the insulator 412, and the conductor 404 are formed (see FIGS. 25B and 25C).

Next, the insulator 411 is formed. The insulator 411 can be deposited by a sputtering method, a CVD method, an MBE method, a PLD method, an ALD method, or the like. Alternatively, the insulator 411 can be formed by a spin coating method, a dipping method, a droplet discharging method (such as an ink-jet method), a printing method (such as screen printing or offset printing), a doctor knife method, a roll coater method, a curtain coater method, or the like.

The insulator 411 is formed to have a flat top surface. For example, the top surface of the insulator 411 may have flatness immediately after the film formation. Alternatively, after the film formation, an upper portion of the insulator 411 and the like may be removed so that the top surface of the insulator 411 becomes parallel to a reference surface such as a rear surface of the substrate. Such treatment is referred to as planarization treatment. As the planarization treatment, for example, CMP treatment, dry etching treatment, or the like can be performed. However, the top surface of the insulator to be the insulator 411 is not necessarily flat.

Next, a resist mask is formed over the insulator 411 by a lithography method or the like. Here, an organic coating film may be provided between the insulator 411 and the resist mask in order to improve the adhesion between the top surface of the insulator 411 and the resist mask. When processing is performed by a photolithography method, an insulator, a conductor, or the like may be used for the mask.

Next, the insulator 411 is subjected to processing by a dry etching method or the like so that openings are formed to reach top surfaces of the conductor 404, and the conductors 430a and 430b.

Figure 26A:
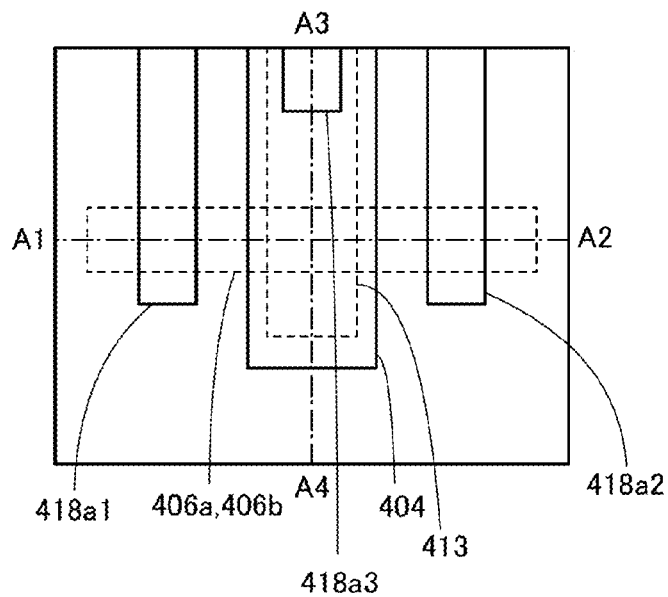
FIGS. 26A to 26C are a top view and cross-sectional views illustrating a method for manufacturing a transistor of one embodiment of the present invention.
Figure 26B:
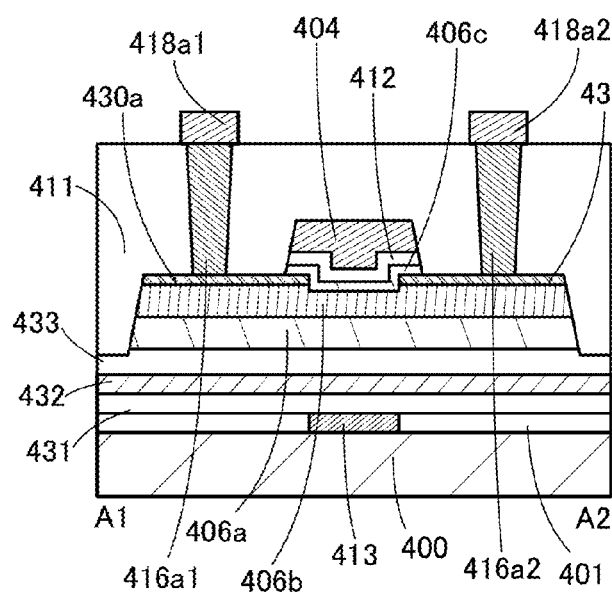
Figure 26C:
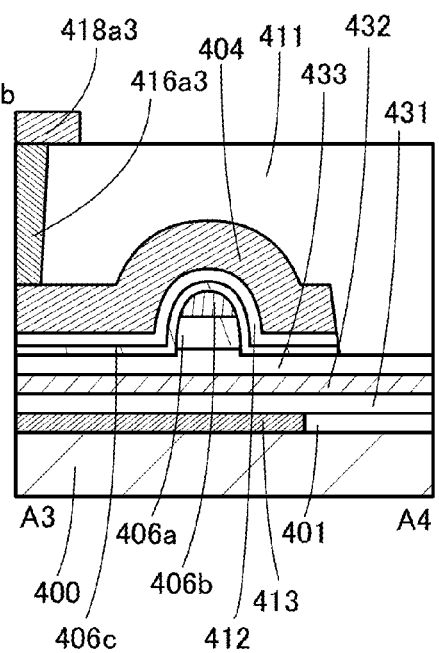

Then, the conductors 416a1, 416a2, and 416a3 which fill the openings and the conductors 418a1, 418a2, and 418a3 which are connected to the conductors 416a1, 416a2, and 416a3, respectively, are formed (see FIGS. 26A to 26C).

In this manner, the transistor in FIGS. 13A to 13C can be manufactured.

In this embodiment, one embodiment of the present invention has been described. Note that one embodiment of the present invention is not limited to the above examples. That is, since various embodiments of the present invention are disclosed in this embodiment and other embodiments, one embodiment of the present invention is not limited to a specific embodiment. The example in which an oxide semiconductor is used as a semiconductor has been described as one embodiment of the present invention; however, one embodiment of the present invention is not limited thereto. Depending on cases or conditions, silicon, germanium, silicon germanium, silicon carbide, gallium arsenide, aluminum gallium arsenide, indium phosphide, gallium nitride, an organic semiconductor, or the like may be used in one embodiment of the present invention.

The structure and method described in this embodiment can be implemented by being combined as appropriate with any of the other structures and methods described in the other embodiments.

Embodiment 4

In this embodiment, an example of forming the transistor M0, the transistor M1, and the capacitor C1 described in Embodiments 1 to 3 is described.

Figure 27A:
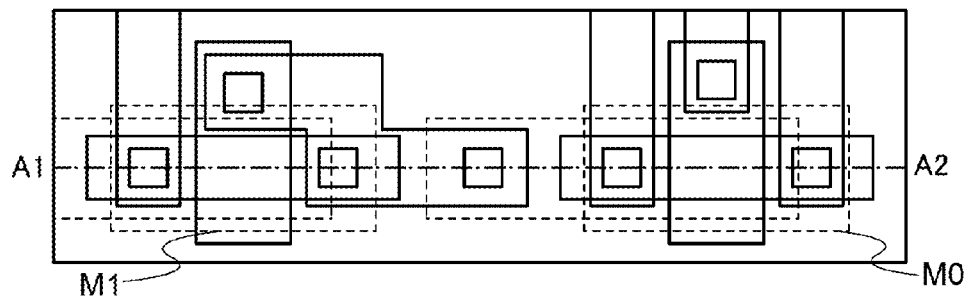
FIG. 27A is a top view of an example of a semiconductor device and FIGS. 27B to 27D are cross-sectional views thereof.
Figure 27B:
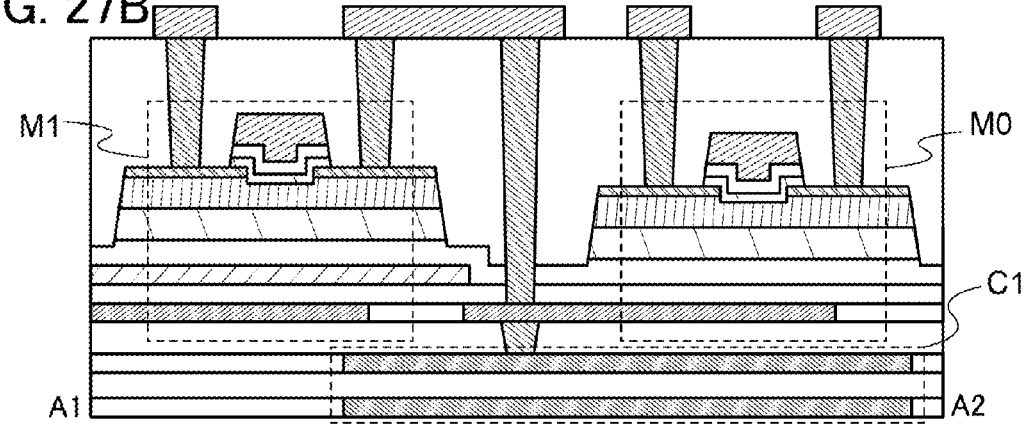
Figure 27C:
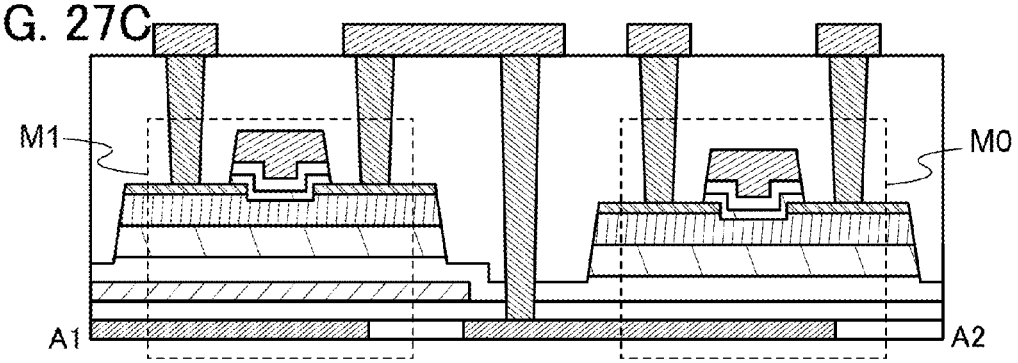
Figure 27D:
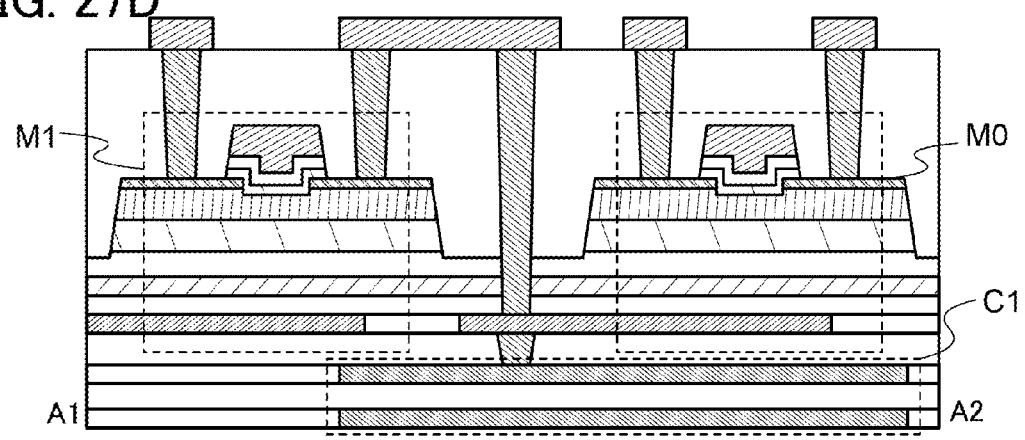

FIG. 27A is a top view of the semiconductor device illustrated in FIGS. 1A to 1C. FIGS. 27B, 27C, and 27D are cross-sectional views taken along dashed-dotted line A1-A2 in FIG. 27A. FIGS. 27B, 27C, and 27D are the cross-sectional views corresponding to FIGS. 1A, 1B, and 1C, respectively. Note that for simplification of the drawing, some components such as the capacitor C1 are not illustrated in the top view in FIG. 27A.

For the detail of the transistor M0 and the transistor M1, Embodiment 3 and the like can be referred to. The capacitor C1 has a planar electrode; however, it is not limited to this. For example, a capacitor having a three-dimensional structure such as a cylinder type or a trench type may be used.

FIG. 27B illustrates the cross-sectional view of the transistor M0, the transistor M1, and the capacitor C1 which are illustrated in FIG. 1A. The transistor M1 is a transistor including the charge trap layer and the transistor M0 is a transistor not including the charge trap layer.

FIG. 27C illustrates the cross-sectional view of the transistor M0 and the transistor M1 which are illustrated in FIG. 1B. The transistor M1 is a transistor including the charge trap layer and the transistor M0 is a transistor not including the charge trap layer.

FIG. 27D illustrates the cross-sectional view of the transistor M0, the transistor M1, and the capacitor C1 which are illustrated in FIG. 1C. The transistor M1 and transistor M0 each include the charge trap layer.

Examples are illustrated in which the transistor M0 and the transistor M1 of the semiconductor device of this embodiment are formed in the same plane; however, one embodiment of the present invention is not limited to this. For example, the transistor M0 and the transistor M1 may be stacked. In that case, the transistor M0 may be formed below the transistor M1 or above the transistor M1.

The capacitor C1 may also be formed in the same plane as the transistor M0 or the transistor M1. Alternatively, the capacitor C1 may be formed above the transistor M0 or the transistor M1.

The structure and method described in this embodiment can be implemented by being combined as appropriate with any of the other structures and methods described in the other embodiments.

Embodiment 5

In this embodiment, a CPU in which the transistor described in Embodiment 1 can be used and the storage device described in Embodiment 2 is included will be described.

Figure 28:
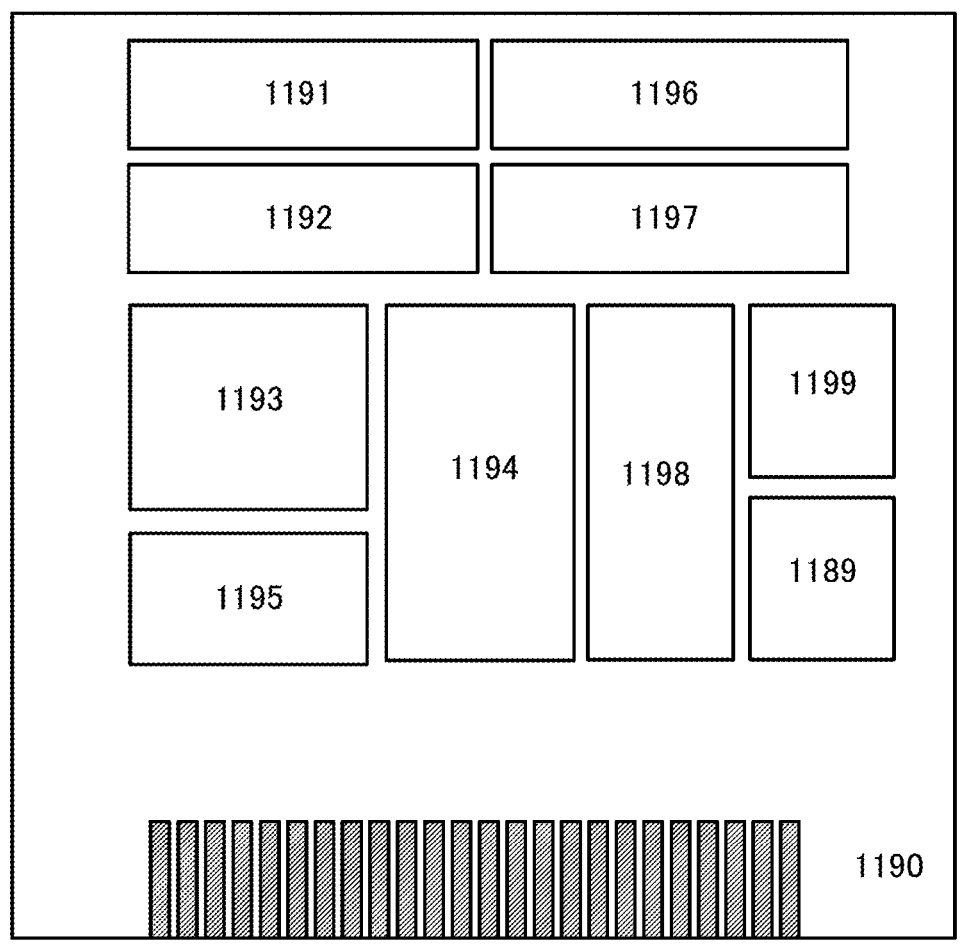
FIG. 28 is a block diagram showing a configuration example of a CPU.

FIG. 28 is a block diagram illustrating a configuration example of a CPU at least partly including any of the transistors described in the above embodiments as a component.

The CPU illustrated in FIG. 28 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 28 is just an example in which the configuration is simplified, and an actual CPU may have a variety of configurations depending on the application. For example, the CPU may have the following configuration: a structure including the CPU illustrated in FIG. 28 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 28, a memory cell is provided in the register 1196. For the memory cell of the register 1196, the transistor described in Embodiment 1 or the storage device described in Embodiment 2 can be used.

In the CPU illustrated in FIG. 28, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply a voltage to the memory cell in the register 1196 can be stopped.

The structures, methods, and the like described in this embodiment can be used as appropriate in combination with any of the structures, methods, and the like described in the other embodiments.

Embodiment 6

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 29A to 29F illustrate specific examples of these electronic devices.

Figure 29A:
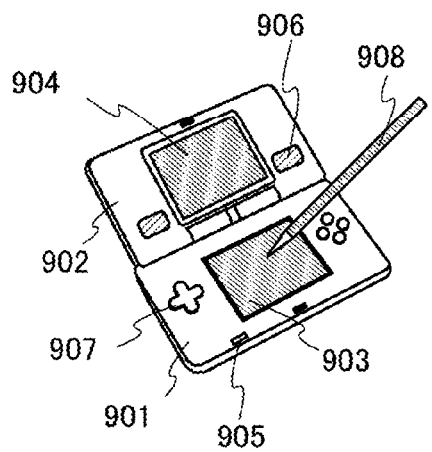
FIGS. 29A to 29F are perspective views each showing an example of an electronic device.

FIG. 29A illustrates a portable game machine which includes a housing 901, a housing 902, a display portion 903, a display portion 904, a microphone 905, a speaker 906, an operation key 907, a stylus 908, and the like. Although the portable game machine in FIG. 29A has the two display portions 903 and 904, the number of display portions included in a portable game machine is not limited to this.

Figure 29B:
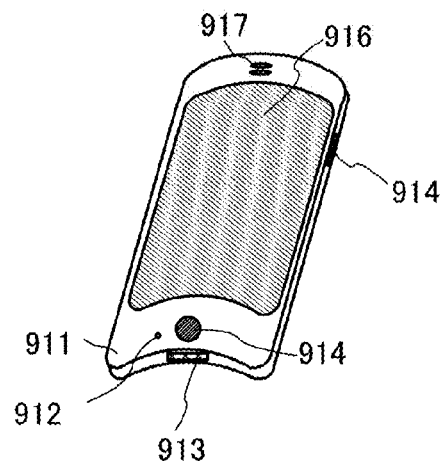

FIG. 29B illustrates a cellular phone which is provided with a housing 911, a display portion 916, operation buttons 914, an external connection port 913, a speaker 917, a microphone 912, and the like. When the display portion 916 of the cellular phone illustrated in FIG. 29B is touched with a finger or the like, data can be input. Furthermore, operations such as making a call and inputting text can be performed by touch on the display portion 916 with a finger or the like. With the operation button 914, the power can be turned on or off. In addition, the type of image displayed on the display portion 916 can be switched with the operation button 914; for example, switching images from a mail creation screen to a main menu screen can be performed.

Figure 29C:
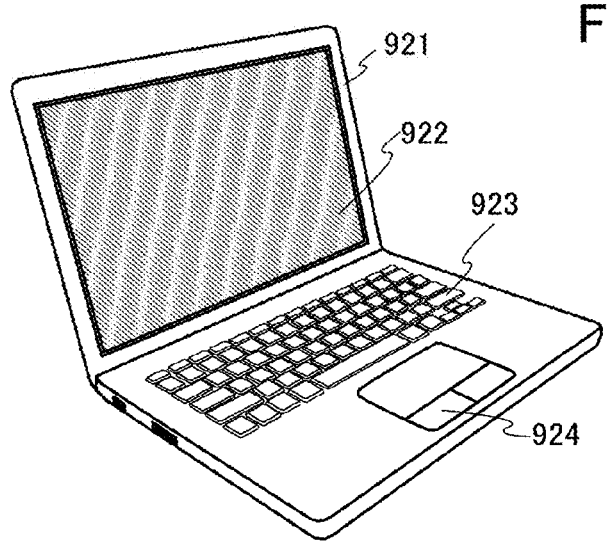

FIG. 29C illustrates a notebook personal computer which includes a housing 921, a display portion 922, a keyboard 923, a pointing device 924, and the like.

Figure 29D:
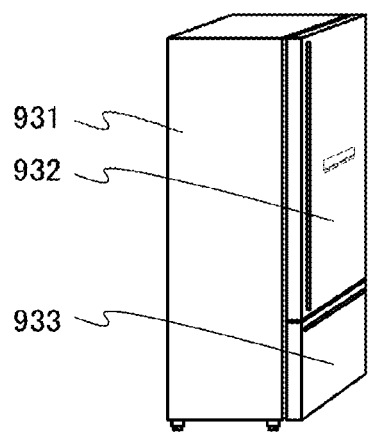

FIG. 29D illustrates an electric refrigerator-freezer which includes a housing 931, a refrigerator door 932, a freezer door 933, and the like.

Figure 29E:
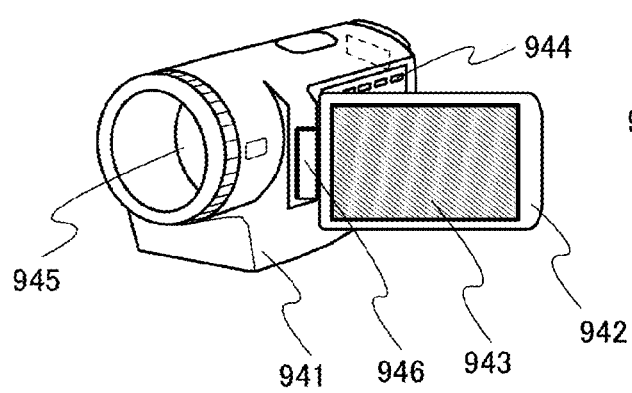

FIG. 29E illustrates a video camera which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 29F:
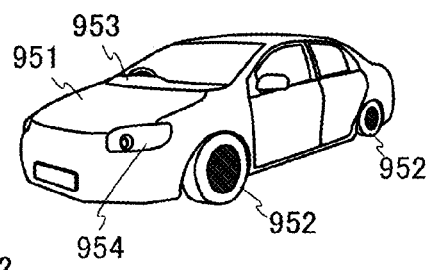
Figure 30A:
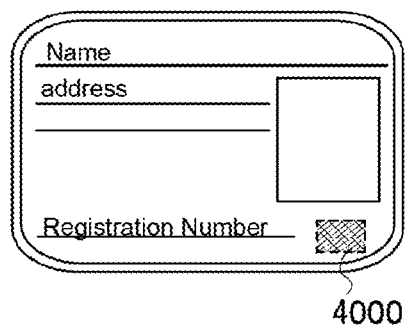
FIGS. 30A to 30F are perspective views each illustrating a usage example of an RFID tag.
Figure 30B:
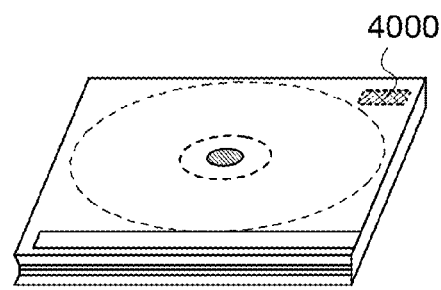
Figure 30C:
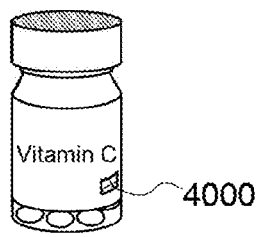
Figure 30D:
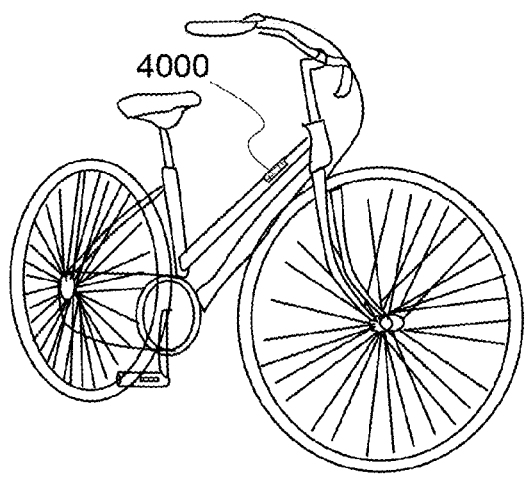
Figure 30E:
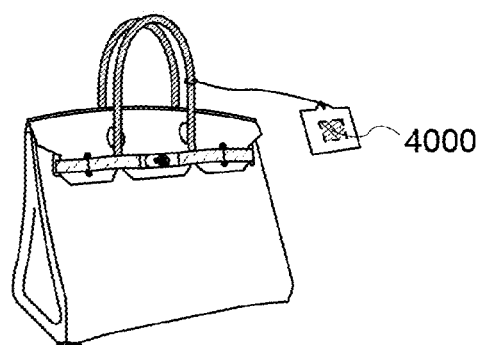
Figure 30F:
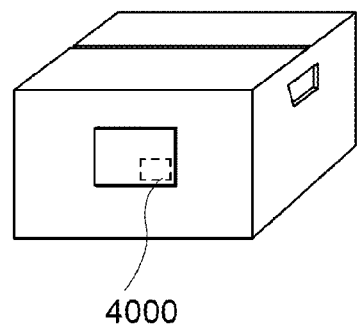

FIG. 29F illustrates an ordinary vehicle, which includes a car body 951, wheels 952, a dashboard 953, lights 954, and the like.

This embodiment can be combined with any of the other embodiments in this specification as appropriate.

Embodiment 7

In this embodiment, application examples of an RF tag that can be formed using the semiconductor device of one embodiment of the present invention will be described with reference to FIGS. 30A to 30F. The RF tag is widely used and can be provided for, for example, products such as bills, coins, securities, bearer bonds, documents (e.g., driver's licenses or residence cards, see FIG. 30A), recording media (e.g., DVDs or video tapes, see FIG. 30B), packaging containers (e.g., wrapping paper or bottles, see FIG. 30C), vehicles (e.g., bicycles, see FIG. 30D), personal belongings (e.g., bags or glasses), foods, plants, animals, human bodies, clothing, household goods, medical supplies such as medicine and chemicals, and electronic appliances (e.g., liquid crystal display devices, EL display devices, television sets, or cellular phones), or tags on products (see FIGS. 30E and 30F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Next, an example of use of a display device that can include the semiconductor device of one embodiment of the present invention will be described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on a current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic effect may be included. Examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a storage circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductor layers included in the LED can also be formed by a sputtering method.

This embodiment can be combined with any of the other embodiments in this specification as appropriate.

This application is based on Japanese Patent Application serial no. 2015-167385 filed with Japan Patent Office on Aug. 27, 2015, the entire contents of which are hereby incorporated by reference.

What is claimed is:

1. A semiconductor device comprising:
a first transistor including a first insulator, a first oxide semiconductor, a first gate, and a second gate;
a second transistor including a second oxide semiconductor, a third gate, and a fourth gate; and
a node electrically connected to one of a source and a drain of the first transistor, the first gate, and the fourth gate,
wherein the first gate and the second gate overlap with each other with the first oxide semiconductor therebetween,
wherein the third gate and the fourth gate overlap with each other with the second oxide semiconductor therebetween,
wherein the first oxide semiconductor and the second gate overlap with each other with the first insulator therebetween, and
wherein the first insulator is configured to hold charges.

2. The semiconductor device according to claim 1, further comprising an input terminal electrically connected to the first gate.

3. The semiconductor device according to claim 1, further comprising a capacitor electrically connected to the node.

4. The semiconductor device according to claim 1,
wherein each of the first oxide semiconductor and the second oxide semiconductor contains one or more elements selected from indium, zinc, and an element M, and
wherein the element M is aluminum, gallium, yttrium, or tin.

5. The semiconductor device according to claim 1,
wherein the first insulator contains one or more elements selected from aluminum, hafnium, gallium, yttrium, and zirconium.

6. The semiconductor device according to claim 1,
wherein the second transistor includes a second insulator between the second oxide semiconductor and the fourth gate, and
wherein the second insulator is configured to hold charges.

7. The semiconductor device according to claim 6,
wherein the second insulator contains one or more elements selected from aluminum, hafnium, gallium, yttrium, and zirconium.

8. A storage circuit comprising the semiconductor device according to claim 1.

9. A register circuit comprising the semiconductor device according to claim 1.

10. A display device comprising:
the semiconductor device according to claim 1, and
a display element.

11. An electronic device comprising:
the semiconductor device according to claim 1, and
at least one of a microphone, a speaker, a display portion, and an operation key.

12. A semiconductor device comprising:
a first transistor including a first insulator, a first oxide semiconductor, a first gate, and a second gate;
a second transistor including a second oxide semiconductor, a third gate, and a fourth gate;
a first input terminal; and
a node electrically connected to one of a source and a drain of the first transistor, the first input terminal, and the fourth gate,
wherein the first gate and the second gate overlap with each other with the first oxide semiconductor therebetween,
wherein the third gate and the fourth gate overlap with each other with the second oxide semiconductor therebetween, wherein the first oxide semiconductor and the second gate overlap with each other with the first insulator therebetween, and wherein the first insulator is configured to hold charges.

13. The semiconductor device according to claim 12, further comprising a second input terminal electrically connected to the first gate.

14. The semiconductor device according to claim 12, further comprising a capacitor electrically connected to the node.

15. The semiconductor device according to claim 12,
wherein each of the first oxide semiconductor and the second oxide semiconductor contains one or more elements selected from indium, zinc, and an element M, and
wherein the element M is aluminum, gallium, yttrium, or tin.

16. The semiconductor device according to claim 12,
wherein the first insulator contains one or more elements selected from aluminum, hafnium, gallium, yttrium, and zirconium.

17. The semiconductor device according to claim 12,
wherein the second transistor includes a second insulator between the second oxide semiconductor and the fourth gate, and
wherein the second insulator is configured to hold charges.

18. The semiconductor device according to claim 17,
wherein the second insulator contains one or more elements selected from aluminum, hafnium, gallium, yttrium, and zirconium.

19. A storage device comprising the semiconductor device according to claim 12.

20. A register circuit comprising the semiconductor device according to claim 12.

21. A display device comprising:
the semiconductor device according to claim 12, and
a display element.

22. An electronic device comprising:
the semiconductor device according to claim 12, and
at least one of a microphone, a speaker, a display portion, and an operation key.

* * * * *